(12) United States Patent
Miyake

(10) Patent No.: US 8,207,487 B2
(45) Date of Patent: Jun. 26, 2012

(54) PHOTOELECTRIC CONVERSION DEVICE INCLUDING CHARGE/DISCHARGE CIRCUIT

(75) Inventor: Hiroyuki Miyake, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 472 days.

(21) Appl. No.: 12/487,233

(22) Filed: Jun. 18, 2009

(65) Prior Publication Data

US 2009/0321616 A1    Dec. 31, 2009

(30) Foreign Application Priority Data

Jun. 25, 2008  (JP) ................... 2008-165958

(51) Int. Cl.
*H03K 17/78* (2006.01)
(52) U.S. Cl. ........... 250/214 DC; 250/214 R; 250/208.2
(58) Field of Classification Search ............... 250/208.1, 250/214.1, 214 R, 214 DC, 208.2; 348/294, 348/297, 298, 302, 311
See application file for complete search history.

(56) References Cited

U.S. PATENT DOCUMENTS

| | | | |
|---|---|---|---|
| 7,180,197 B2 | 2/2007 | Nishi et al. | |
| 7,253,391 B2 | 8/2007 | Koyama et al. | |
| 7,335,951 B2 | 2/2008 | Nishi et al. | |
| 7,449,718 B2 | 11/2008 | Nishi et al. | |
| 7,492,028 B2 | 2/2009 | Nishi et al. | |
| 7,495,272 B2 | 2/2009 | Maruyama et al. | |
| 7,501,306 B2 | 3/2009 | Nishi et al. | |
| 2005/0168601 A1* | 8/2005 | Lim | 348/241 |
| 2006/0170803 A1* | 8/2006 | Lim | 348/308 |
| 2006/0244854 A1* | 11/2006 | Krymski | 348/308 |
| 2006/0270114 A1 | 11/2006 | Nishi et al. | |
| 2007/0187790 A1 | 8/2007 | Takahashi et al. | |
| 2007/0267665 A1 | 11/2007 | Koyama et al. | |
| 2008/0001148 A1 | 1/2008 | Nishi et al. | |
| 2008/0012741 A1* | 1/2008 | Nakata et al. | 341/155 |
| 2008/0108205 A1 | 5/2008 | Nishi et al. | |
| 2009/0117681 A1 | 5/2009 | Maruyama et al. | |

FOREIGN PATENT DOCUMENTS

| | | |
|---|---|---|
| JP | 6-313840 | 11/1994 |
| JP | 2002-286504 | 10/2002 |

* cited by examiner

*Primary Examiner* — Francis M Legasse, Jr.
(74) *Attorney, Agent, or Firm* — Nixon Peabody LLP; Jeffrey L. Costellia

(57) ABSTRACT

In order to improve resolution to the illuminance of light, the present invention comprises a photoelectric conversion circuit for generating a first current in accordance with illuminance of incident light, a charge/discharge circuit whose electrical capacitance changes in accordance with the first current, a first switching element which is turned on or off so as to control conduction between the photoelectric conversion circuit and the charge/discharge circuit, a current circuit for generating a second current with a constant amount, a second switching element which is turned on or off so as to control conduction between the charge/discharge circuit and the current circuit, and a comparator including a first input terminal and a second input terminal, wherein a signal with a reference potential is input to the first input terminal and the second input terminal is electrically connected to the charge/discharge circuit are provided.

21 Claims, 19 Drawing Sheets

PHOTOELECTRIC CONVERSION DEVICE INCLUDING CHARGE/DISCHARGE CIRCUIT

BACKGROUND OF THE INVENTION

1. Field of the Invention

The present invention relates to a photoelectric conversion device and an electronic appliance.

2. Description of the Related Art

A large number of photoelectric conversion devices used for detecting electromagnetic waves are known and, for example, photoelectric conversion devices having sensitivity to UV rays to infrared rays are collectively referred to as optical sensors. Among them, an optical sensor having sensitivity to visible rays with a wavelength of 400 nm to 700 nm is particularly referred to as a visible light sensor, and a large number of visible light sensors are used for devices and the like which need luminance adjustment, on/off control, or the like in accordance with a human living environment.

In some display devices, ambient brightness of the display devices is detected so as to adjust the display luminance. This is because the visibility can be improved and surplus power consumption of the display device can be reduced by detecting the ambient brightness by an optical sensor and providing appropriate display luminance. For example, examples of a display device which has an optical sensor for adjusting the luminance include cellular phones and computers provided with display portions. In addition, as well as the ambient brightness of the display portion, the luminance of the backlight of a display device, a liquid crystal display device in particular, is detected by an optical sensor so as to adjust the luminance of a display screen.

An optical sensor, which is a photoelectric conversion device, includes a photoelectric conversion element such as a photodiode in a light sensing portion. Based on the amount of current flowing to the photoelectric conversion element, the light intensity can be detected. Patent Document 1 describes an optical sensor of charge accumulation type, specifically describes a structure in which electric charge accumulated in a capacitor (also called a capacitor element) by current flowing from a photodiode in accordance with the amount of incident light is discharged by a constant current circuit (also called a constant current source) and then the change in potential due to the discharge is detected by a comparator and based on the time required for the change in potential which is detected by the comparator, a digital signal is generated with use of a counter circuit and a latch circuit.

PATENT DOCUMENT

[Patent Document 1] Japanese Published Patent Application No. H6-313840.

SUMMARY OF THE INVENTION

However, conventional photoelectric conversion devices have a problem of low resolution to the illuminance of incident light in a photoelectric conversion process. For example, when light with high illuminance above a certain level enters a conventional photoelectric conversion device and the amount of charge corresponding to generated photocurrent exceeds the upper limit of accumulation of a capacitor, the capacitor can store only the charge whose amount corresponds to its electrical capacitance. Therefore, for example, when this device is mounted on a display device or the like, the display luminance cannot be adjusted to be desired luminance.

In view of the above problem, an object of an embodiment of the present invention is to improve resolution to the illuminance of light in a photoelectric conversion process.

A photoelectric conversion device according to an embodiment of the present invention includes a photoelectric conversion circuit for generating a first current in accordance with the illuminance of incident light, a charge/discharge circuit including a charge/discharge means whose electrical capacitance changes in accordance with the first current, a first switching element which is turned on or off so as to control conduction between the photoelectric conversion circuit and the charge/discharge circuit, a current circuit for generating a second current with a constant amount, a second switching element which is turned on or off so as to control conduction between the charge/discharge circuit and the current circuit, and a comparator including a first input terminal and a second input terminal, wherein a signal with a reference potential is input to the first input terminal and the second input terminal is electrically connected to the charge/discharge circuit.

In the above structure, the first switching element can be off when the second switching element is on and the second switching element can be off when the first switching element is on.

In the above structure, the charge/discharge circuit includes a first terminal and a second terminal, a first capacitor whose first terminal is electrically connected to the second input terminal of the comparator, a second capacitor including a first terminal and a second terminal, and a third switching element which is turned on or off in accordance with the first current and turned on or off so as to control conduction between the first terminal of the first capacitor and the first terminal of the second capacitor.

In the above structure, a fourth switching element which is turned on or off so as to control conduction between the second input terminal of the comparator and an output terminal of the comparator may be further provided.

In the above structure, a comparison circuit which compares a second reference potential and a potential at a connection portion between the second input terminal of the comparator and the charge/discharge circuit and which outputs a control signal for controlling the on/off of the third switching element based on the result of the comparison may be further provided.

In the above structure, the photoelectric conversion circuit may include a photoelectric conversion element and an amplifier circuit for amplifying current flowing to the photoelectric conversion element.

In the above structure, a clock signal generating circuit for generating a clock signal, a counter circuit for counting an edge of the clock signal, and a latch circuit for holding the count value of the counter circuit in accordance with an output signal of the comparator may be further provided.

Another embodiment of the present invention is an electronic appliance on which the above photoelectric conversion device is mounted.

Note that in this document (the specification, the scope of claims, the drawing, and the like), a transistor includes at least three terminals of a gate terminal, a source terminal, and a drain terminal. The gate terminal corresponds to a gate electrode portion (including a region serving as a gate, a conductive layer, a wiring, and the like) or part of a portion which is electrically connected to a gate electrode. The source terminal corresponds to a source electrode portion (including a region serving as a source, a conductive layer, a wiring, and the like) or part of a portion which is electrically connected to a source electrode. The drain terminal corresponds to a drain electrode portion (including a region serving as a drain, a conductive layer, a wiring, and the like) or part of a portion which is electrically connected to a drain electrode. A transistor includes a channel region between a drain region and a source region and current can flow between the drain region and the source region in accordance with the potential of the gate terminal.

In addition, in this document (the specification, the scope of claims, the drawings, and the like), since a source terminal and a drain terminal of a transistor are switched to each other depending on the structure, an operating condition, or the like of the transistor, it is difficult to define which terminal is the source terminal or the drain terminal. Therefore, in this document (the specification, the scope of claims, the drawings, and the like), one terminal which is arbitrarily selected from a source terminal and a drain terminal is called one of the source terminal and the drain terminal, whereas the other terminal is called the other of the source terminal and the drain terminal.

In this document (the specification, the scope of claims, and the like), the capacitor includes a pair of electrodes and a dielectric layer. A terminal on one electrode side is referred to as a first terminal and a terminal on the other electrode side is referred to as a second terminal.

In this document (the specification, the scope of claims, and the like), when it is explicitly described that "B is formed on A" or "B is formed over A", it does not necessarily mean that B is formed in direct contact with A; in some cases, A and B are not directly contact with each other when another object is interposed between A and B. Here, each of A and B is an object (e.g., a device, an element, a circuit, a wiring, an electrode, a terminal, a conductive film, or a layer).

Accordingly, for example, when "a layer B is formed on (or over) a layer A" is explicitly described, it includes both the case where the layer B is formed on and in direct contact with the layer A and the case where a different layer (e.g., a layer C or a layer D) is formed on and in direct contact with the layer A and the layer B is formed on and in direct contact with the layer C or D. Note that the different layer (e.g., the layer C or the layer D) may be a single layer or a plurality of layers.

Note that when it is explicitly described that "B is formed on A", or "B is formed over A", it includes the case where B is formed obliquely above A.

According to an embodiment of the present invention, the resolution to the illuminance of light in a photoelectric conversion process can be improved.

DETAILED DESCRIPTION OF THE INVENTION

Embodiments of the present invention are hereinafter described with reference to drawings. However, the present invention is not limited to the following description, and a variety of changes and modifications of the modes and details thereof will be apparent to those skilled in the art unless such changes and modifications depart from the spirit and scope of the present invention. Therefore, the present invention should not be construed as being limited to the description of Embodiments to be given below.

Embodiment 1

Embodiment 1 describes a photoelectric conversion device which is an embodiment of the present invention.

Figure 1:
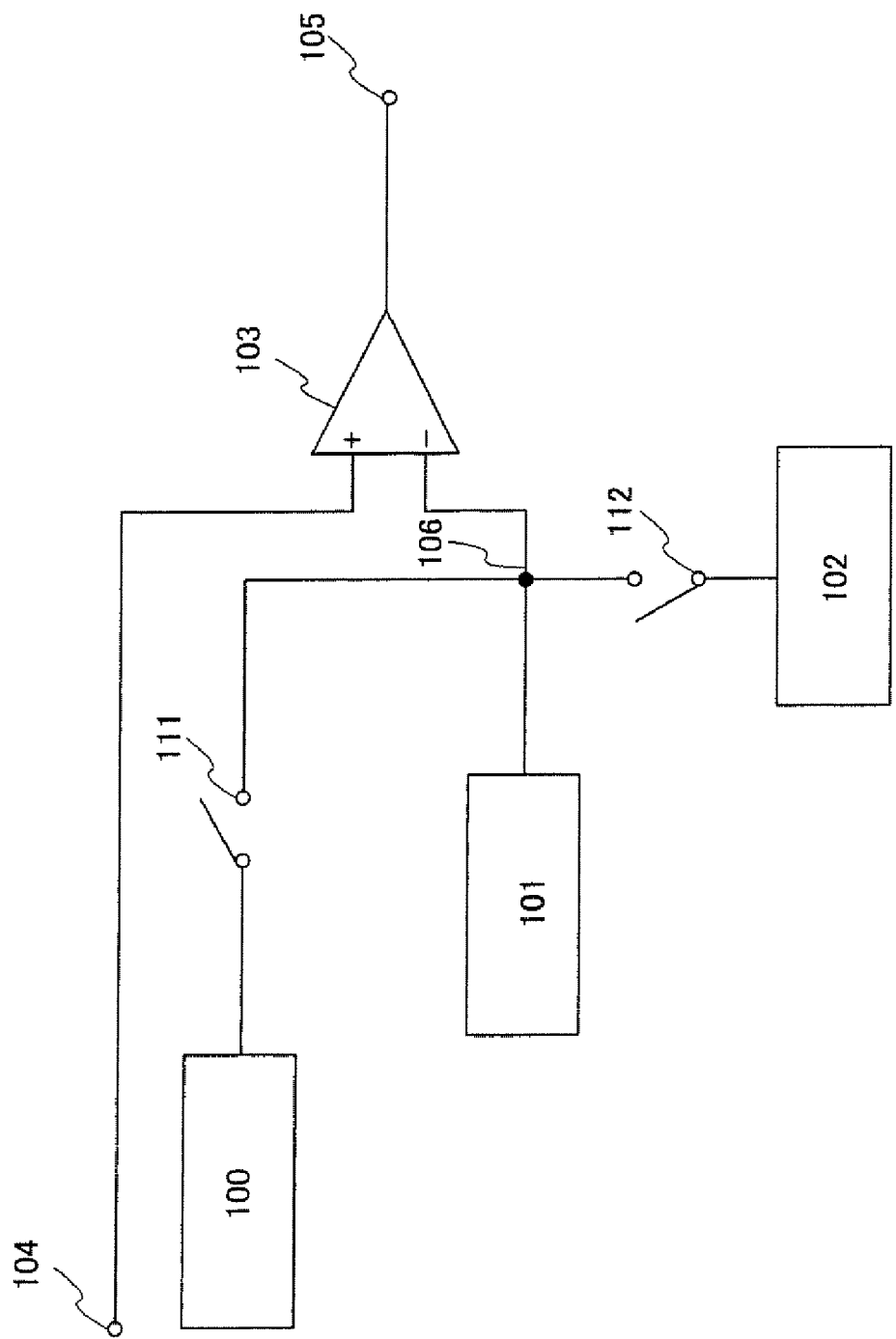
FIG. 1 is a circuit diagram which illustrates an example of a circuit configuration of a photoelectric conversion device in Embodiment 1.

First, a structure of the photoelectric conversion device of Embodiment 1 is described with reference to FIG. 1. FIG. 1 is a circuit diagram which illustrates an example of a circuit configuration of a photoelectric conversion device in Embodiment 1.

The photoelectric conversion device illustrated in FIG. 1 includes at least a photoelectric conversion circuit 100, a charge/discharge circuit 101, a current circuit 102, a comparator 103, a first switching element 111, and a second switching element 112.

In this document (including the specification, the scope of claims, and the like), the photoelectric conversion refers to generation of current corresponding to the illuminance of incident light.

Moreover, in this document (including the specification, the scope of claims, and the like), the ordinal number such as "first" or "second" is given in order to avoid confusion between the elements, and does not limit the number of the elements.

The photoelectric conversion circuit 100 has a function of generating a first current (also called $I_L$) in accordance with the illuminance of light which enters from outside. The amount of the first current depends on the illuminance of the light.

The charge/discharge circuit 101 has a charge/discharge means. By the use of the charge/discharge means, the electrical capacitance can be gradually changed in accordance with the amount of the first current in the photoelectric conversion circuit 100.

The current circuit 102 has a function of generating a constant amount of a second current (also called a constant current).

The comparator 103 is electrically connected to the charge/discharge circuit 101. Moreover, the comparator 103 has a function of comparing a reference potential (also called a first reference potential) and the potential of a connection portion between the comparator 103 and the charge/discharge circuit 101 and outputting an output signal in accordance with the result of the comparison.

The circuit configuration of the photoelectric conversion device illustrated in FIG. 1 is described in detail.

The charge/discharge circuit 101 is electrically connected to the photoelectric conversion circuit 100 via the first switching element 111. That is to say, the first switching element 111 is turned on or off so as to control the conduction between the photoelectric conversion circuit 100 and the charge/discharge circuit 101.

There is no particular limitation on the first switching element 111 and the second switching element 112 as long as they can control the conduction or nonconduction between one terminal and the other terminal. As each of the first switching element 111 and the second switching element 112, a switching element which operates electrically (also called an electrical switching element), a switching element which operates mechanically (also called a mechanical switching element), or the like can be used, for example, a thin film transistor may be used. Alternatively, an analog switch including a plurality of thin film transistors can be used. The first switching element 111 has a function of turning off when the second switching element 112 is turned on, and the second switching element 112 has a function of turning off when the first switching element 111 is turned on.

The current circuit 102 is electrically connected to the charge/discharge circuit 101 via the second switching element 112. That is to say, the second switching element 112 is turned on or off so as to control the conduction between the current circuit 102 and the charge/discharge circuit 101.

The comparator 103 includes a first terminal (also called an inverting input terminal or a first input terminal), a second terminal (also called an input terminal or a second input terminal), and a third terminal (also called an output terminal). The first terminal of the comparator 103 is electrically connected to a potential supply terminal 104. The second terminal of the comparator 103 is electrically connected to the charge/discharge circuit 101, electrically connected to the photoelectric conversion circuit 100 via the first switching element 111, and electrically connected to the current circuit 102 via the second switching element 112. The third terminal of the comparator 103 is electrically connected to an output terminal 105. That is to say, the first switching element 111 is turned on or off so as to control the conduction between the photoelectric conversion circuit 100 and the second terminal of the comparator 103, and the second switching element 112 is turned on or off so as to control the conduction between the current circuit 102 and the second terminal of the comparator 103. In FIG. 1, the connection portion between the second input terminal of the comparator 103 and the charge/discharge circuit 101 is also called a node 106.

The photoelectric conversion circuit 100 can be formed using, for example, a photoelectric conversion element. As the photoelectric conversion element, a photodiode, a phototransistor, or the like can be used, for example. The photoelectric conversion circuit 100 can alternatively be formed using a photoelectric conversion element and an amplifier circuit. By the provision of an amplifier circuit, the output current can be amplified; as a result, even though the illuminance of incident light is too low to perform photoelectric conversion, the output current with the amount enough to perform photoelectric conversion can be generated. The amplifier circuit can be formed using, for example, a current mirror circuit or the like.

The charge/discharge circuit 101 can be formed using, for example, a switching element and a plurality of capacitors which is connected to each other in parallel via the switching element and which serves as a charge/discharge means. As the switching element, a switching element which is similar to the switching element that can be used as the first switching element 111 or the second switching element 112 can be employed. The charge/discharge circuit 101 can be formed using a variable capacitor.

The current circuit 102 can be formed using a current source which generates the second current with a constant amount. In this specification, the term "constant" includes what is substantially constant.

A reference potential (also called $V_{ref}$) is applied to the photoelectric conversion device of Embodiment 1 via the potential supply terminal 104. The $V_{ref}$ can be determined in consideration of the structure of the photoelectric conversion device.

Figure 2:
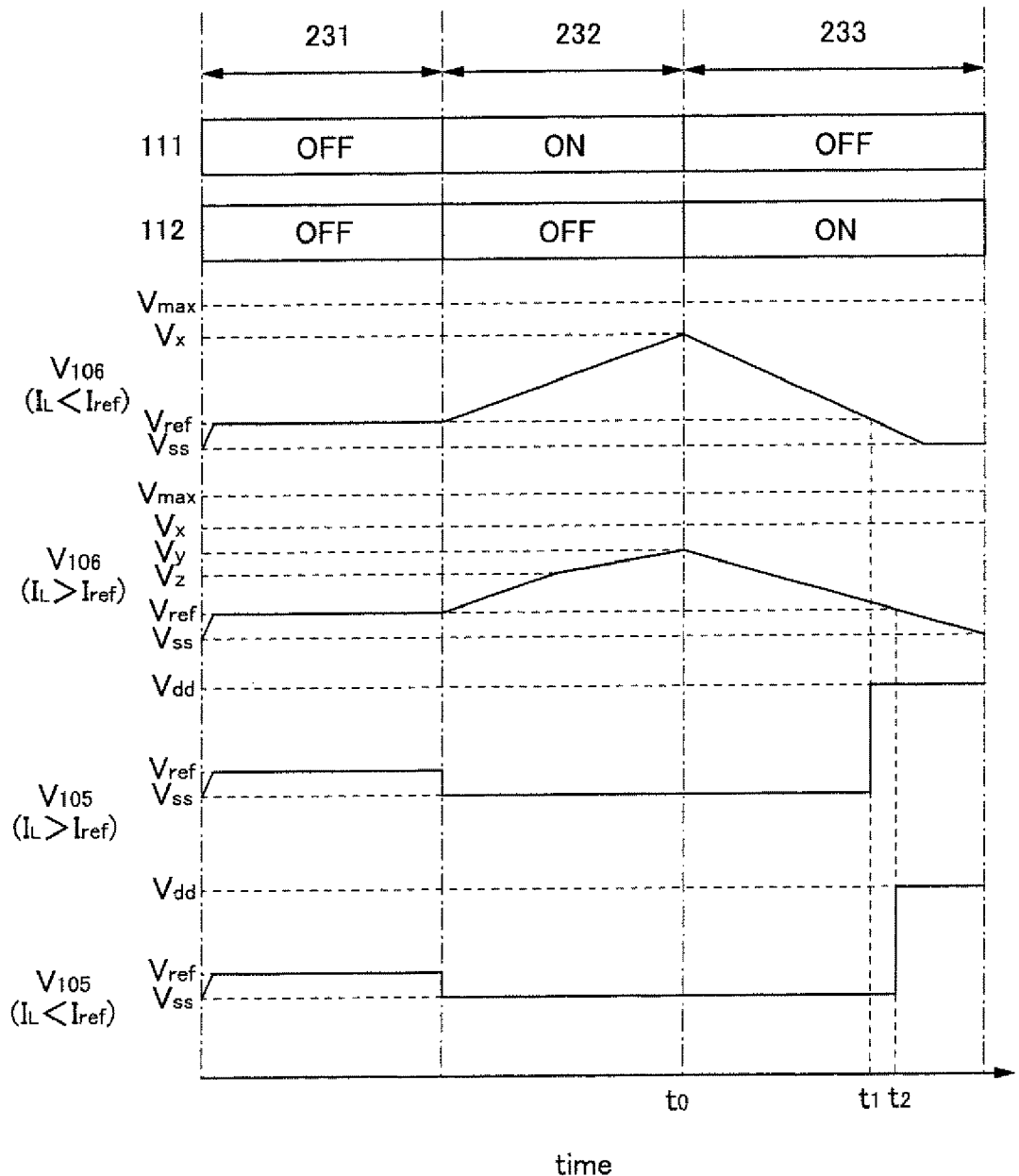
FIG. 2 is a timing chart of the operation of the photoelectric conversion device illustrated in FIG. 1.

Next, the operation of the photoelectric conversion device illustrated in FIG. 1 is described with reference to FIG. 2. FIG. 2 is a timing chart of the operation of the photoelectric conversion device of FIG. 1. Embodiment 1 describes the cases where the amount of the first current generated by the photoelectric conversion circuit 100 is smaller and larger than the amount (also called $I_{ref}$) of a reference current. Note that the $I_{ref}$ is set as appropriate in consideration of the electric capacitance of the charge/discharge means in the charge/discharge circuit 101.

As FIG. 2 indicates, the operation of the photoelectric conversion device illustrated in FIG. 1 is divided into a first period 231, a second period 232, and a third period 233. Note that the second period 232 is an accumulation period and the third period 233 is a discharge period.

First, the case where the $I_L$ is smaller than the $I_{ref}$ is described. Here, the electrical capacitance of the charge/discharge circuit 101 is expressed as Ca.

First, in the first period 231, the first switching element 111 is off and the second switching element 112 is off.

The potential (also called $V_{106}$) of the node 106 is reset at this time, thereby becoming $V_{ref}$. Although not illustrated, the $V_{ref}$ can be applied via the potential supply terminal 104 or a different terminal provided additionally. When the output terminal and the second input terminal of the comparator 103 are electrically connected to each other via a switching element, the $V_{ref}$ can be set at the value obtained by subtracting an offset potential of the comparator 103 from the $V_{ref}$.

Accordingly, input/output signals of the comparator can be corrected even though the offset potential of the comparator 103 changes over time.

Furthermore, the potential (also called $V_{105}$) of the output signal output via the output terminal 105 at this time becomes the $V_{ref}$. This is the operation performed in the first period 231.

Next, in the second period 232, the first switching element 111 is on and the second switching element 112 is off.

In the charge/discharge circuit 101, electric charge whose amount corresponds to the amount of the first current generated in the photoelectric conversion circuit 100 is accumulated. At this time, the $V_{106}$ increases up to $V_x$ at the time $t_0$. Note that the $V_x$ is a given value that is higher than a ground potential (also called $V_{ss}$) and lower than a potential $V_{max}$ at which electric charge is accumulated as much as possible in the charge/discharge circuit 101.

The $V_{105}$ at this time is the $V_{ss}$ (also called a low state) because the $V_{106}$ is higher than the $V_{ref}$ and the output signal of the comparator 103 has the $V_{ss}$. This is the operation performed in the second period 232.

Next, in the third period 233, the first switching element 111 is off and the second switching element 112 is on.

At this time, the second current flows to the current circuit 102 and the electric charge accumulated in the charge/discharge circuit 101 in the first period 231 is released for every constant amount in accordance with the second current. At this time, the $V_{106}$ decreases to become the $V_{ref}$ at the time $t_1$ and then become the $V_{ss}$. The length of time for which the $V_{106}$ decreases from the $V_x$ to the $V_{ref}$ (also called a discharge time), i.e., the time from $t_0$ to $t_1$ differs depending on the amount of electric charge accumulated in the charge/discharge circuit 101. The amount of electric charge accumulated in the charge/discharge circuit 101 differs depending on the electrical capacitance of the charge/discharge circuit 101 or the amount of the first current generated by the photoelectric conversion circuit 100.

The $V_{105}$ at this time is $V_{dd}$ (also called a high state) because the $V_{106}$ is lower than the $V_{ref}$ and the output signal of the comparator 103 has the $V_{dd}$. Note that the $V_{dd}$ is a potential with a given value that is higher than the $V_{ss}$. This is the operation performed in the third period 233.

In the photoelectric conversion device of Embodiment 1, a signal with the potential corresponding to the illuminance of light that enters the photoelectric conversion circuit 100 can be generated by utilizing the discharge time of the charge/discharge circuit 101 in the second period 232.

Next, the case where the $I_L$ is larger than the $I_{ref}$ is described.

The first period in this case is similar to that in the case where the $I_L$ is smaller than the $I_{ref}$; therefore, the description of the operation of the photoelectric conversion device in the case where the $I_L$ is smaller than the $I_{ref}$ is referred to.

Next, in the second period 232, the first switching element 111 is on and the second switching element 112 is off.

In the charge/discharge circuit 101, electric charge whose amount corresponds to the amount of the first current generated in the photoelectric conversion circuit 100 is accumulated. At this time, the $V_{106}$ increases up to $V_z$ at which the electrical capacitance of the charge/discharge circuit 101 changes into Cb, which is higher than Ca. The electric charge is accumulated further in the charge/discharge circuit 101, so that the $V_{106}$ increases up to $V_y$ at the time $t_0$. The $V_y$ is a given value that is higher than the $V_{ss}$ and lower than the $V_{max}$ at which the electric charge is accumulated as much as possible in the charge/discharge circuit 101. The increase of the $V_{106}$ per unit time is smaller than that in the case where the $I_L$ is smaller than the $I_{ref}$. Therefore, in the case where the $I_L$ is larger than the $I_{ref}$, the electric charge can be accumulated in the charge/discharge circuit 101 in accordance with the first current in such a manner that the amount of the electric charge which corresponds to the amount of the first current does not exceed the upper limit of accumulation of the charge/discharge circuit 101.

The $V_{105}$ at this time is the $V_{ss}$ because the $V_{106}$ is lower than the $V_{ref}$ and the potential of the output signal which is output via the output terminal of the comparator 103 is the $V_{ss}$. This is the operation performed in the second period 232.

Next, in the third period 233, the first switching element 111 is off and the second switching element 112 is on.

At this time, the second current flows to the current circuit 102 and the electric charge accumulated in the charge/discharge circuit 101 in the first period 231 is released for every constant amount in accordance with the amount of the second current. At this time, the $V_{106}$ decreases to become the $V_{ref}$ at the time $t_2$ and then become the $V_{ss}$. The length of time for which the $V_{106}$ decreases from the $V_y$ to the $V_{ref}$ (also called a discharge time), i.e., the time from $t_0$ to $t_2$ differs depending on the amount of electric charge accumulated in the charge/discharge circuit 101. The amount of electric charge accumulated in the charge/discharge circuit 101 differs depending on the amount of the first current generated by the photoelectric conversion circuit 100. The $V_{105}$ at this time is the $V_{dd}$ because the $V_{106}$ is higher than the $V_{ref}$ and an output signal with the potential $V_{dd}$ is output via the output terminal of the comparator 103. This is the operation performed in the third period 233.

Note that the second period 232 is the charge period and the third period 233 is the discharge period in the operation of the photoelectric conversion device illustrated in FIG. 1; however, there is no limitation to this. The photoelectric conversion device of Embodiment 1 can have a structure in which the second period 232 is the discharge period and the third period 233 is the charge period, so that in the charge/discharge circuit 101 where a predetermined amount of the electric charge is accumulated in advance in the first period 231, the electric charge is released in the second period 232 and the electric charge is accumulated in the third period 233. At this time, a signal with the potential corresponding to the illuminance of light that enters the photoelectric conversion circuit 100 can be generated by utilizing the time for which a predetermined amount of the electric charge is accumulated in the charge/discharge circuit 101 in the second period 232.

As described thus, the electrical capacitance of the charge/discharge means of the charge/discharge circuit is changed in accordance with the amount of the first current generated in the photoelectric conversion circuit, that is, in accordance with the illuminance of the incident light. Accordingly, the electric charge can be accumulated in or released from the charge/discharge circuit in accordance with the first current in such a manner that the amount of the electric charge which corresponds to the amount of the first current does not exceed the upper limit of accumulation of the charge/discharge circuit. Therefore, the resolution to the illuminance in the photoelectric conversion process can be improved.

Figure 3:
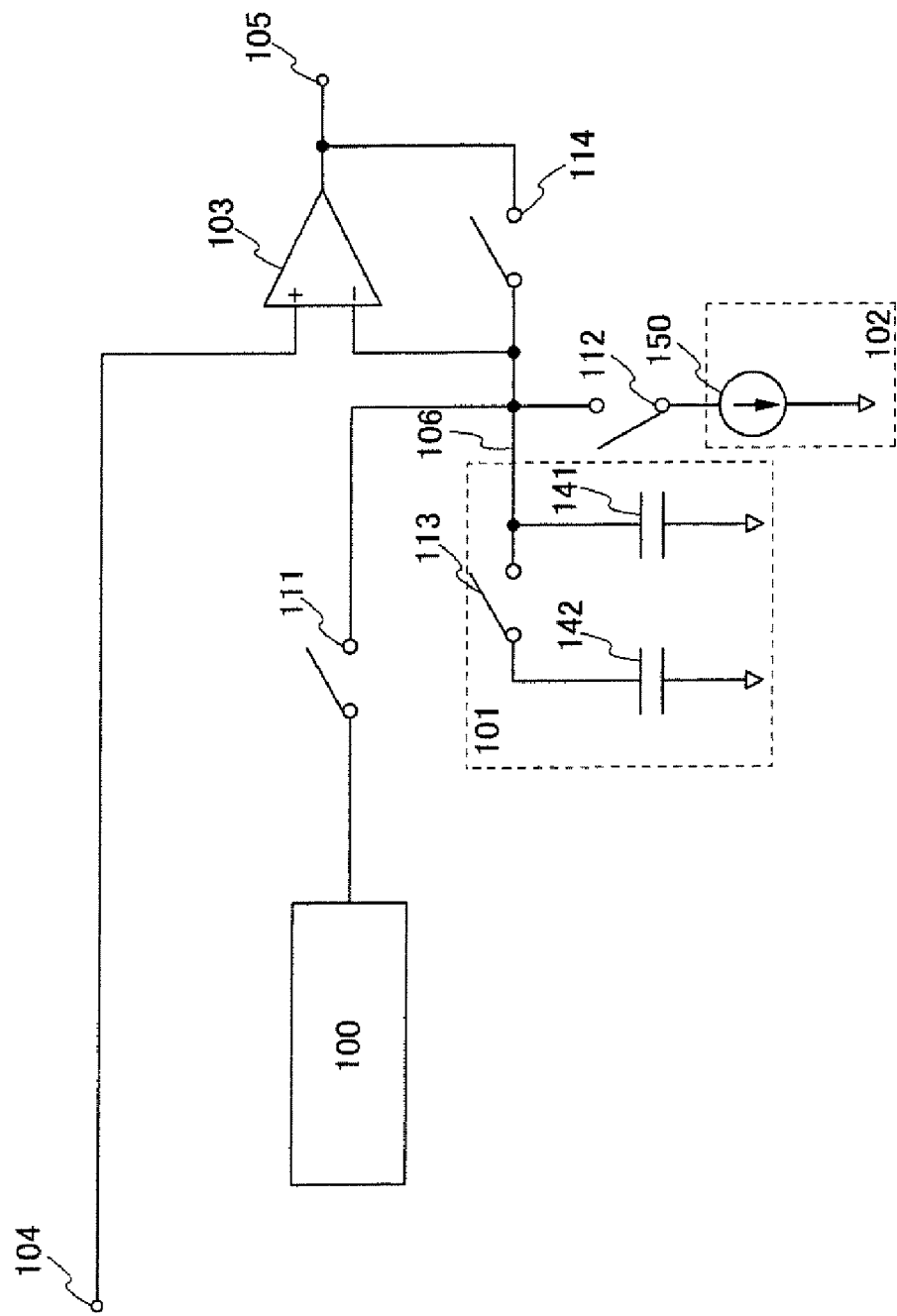
FIG. 3 is a circuit diagram which illustrates an example of a circuit configuration of the photoelectric conversion device in Embodiment 1.

Further, another structure of the photoelectric conversion device of Embodiment 1 is described with reference to FIG. 3. FIG. 3 is a circuit diagram which illustrates an example of a structure of a photoelectric conversion device in Embodiment 1.

The photoelectric conversion device illustrated in FIG. 3 includes the photoelectric conversion circuit 100, the charge/discharge circuit 101, the current circuit 102, the comparator 103, the potential supply terminal 104, the output terminal 105, the node 106, the first switching element 111, and the second switching element 112. Note that for the circuits and the elements which are denoted with the same reference numerals as those of the photoelectric conversion device illustrated in FIG. 1, the description of the structures of the elements and circuits in the photoelectric conversion device of FIG. 1 is referred to as appropriate, and the description of those circuits and elements in FIG. 3 is not made.

Further, the structure of the photoelectric conversion device illustrated in FIG. 3 is described in detail.

First, the structure of the photoelectric conversion circuit 100 is described.

Figure 4:
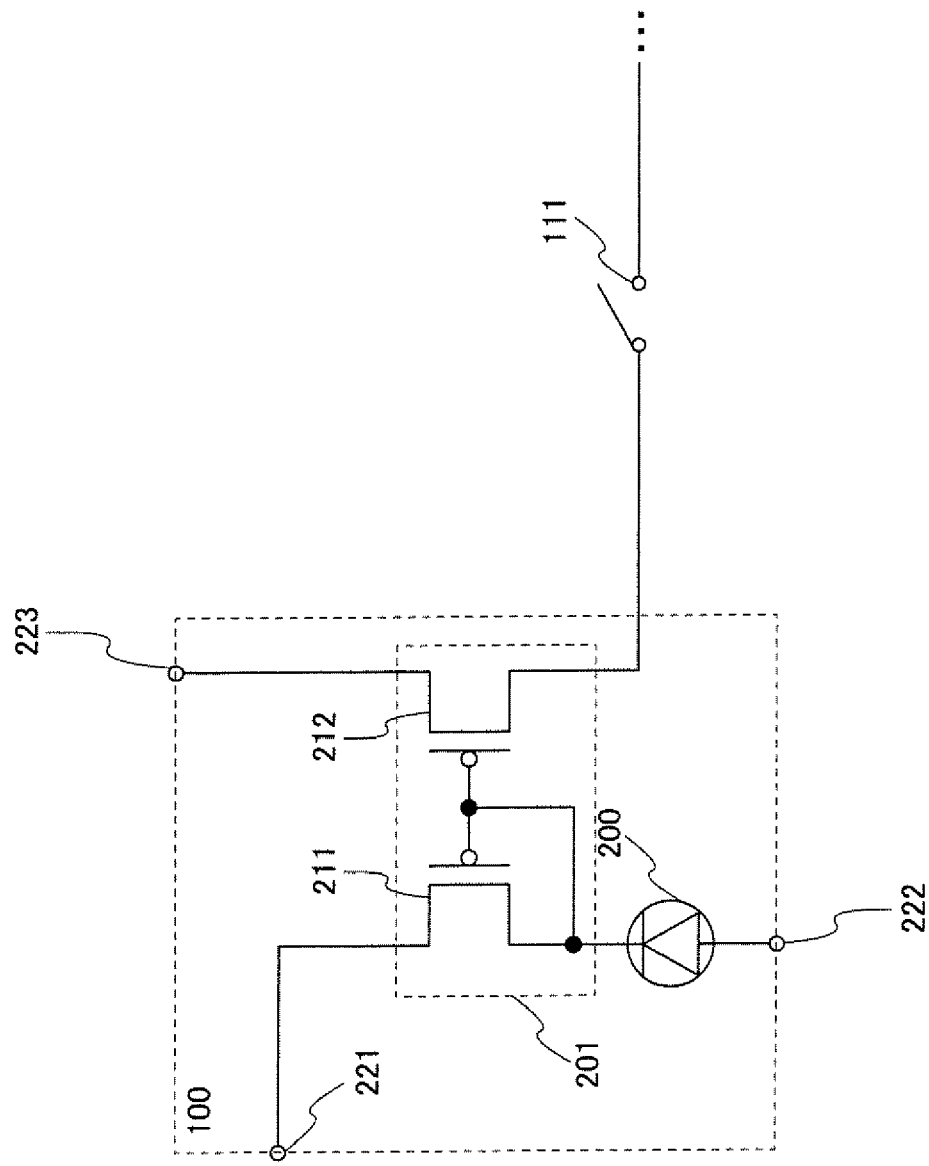
FIG. 4 is a circuit diagram which illustrates an example of a circuit configuration of a photoelectric conversion circuit of the photoelectric conversion device in Embodiment 1.

The structure of the photoelectric conversion circuit 100 is described with reference to FIG. 4. FIG. 4 illustrates an example of the structure of the photoelectric conversion circuit 100 in Embodiment 1.

The photoelectric conversion circuit 100 illustrated in FIG. 4 includes at least a photoelectric conversion element 200 and an amplifier circuit 201.

The photoelectric conversion element 200 has a function of generating photocurrent corresponding to the illuminance of incident light.

The amplifier circuit 201 has a function of amplifying output current in accordance with the photocurrent generated by the photoelectric conversion element 200.

Further, the amplifier circuit 201 can be formed using a current mirror circuit including a first transistor 211 serving as a reference transistor and a second transistor 212 serving as an output transistor. Although the photoelectric conversion device illustrated in FIG. 4 includes the current mirror circuit including the first transistor 211 and the second transistor 212, there is no limitation to this. The photoelectric conversion circuit in the photoelectric conversion device of Embodiment 1 may include a current mirror circuit including a plurality of the first transistors 211 and a plurality of the second transistors 212.

Further, the photoelectric conversion circuit 100 includes a first potential supply terminal 221, a second potential supply terminal 222, and a third potential supply terminal 223, in addition to the photoelectric conversion element 200 and the amplifier circuit 201.

A first terminal (a terminal on an anode side) of the photoelectric conversion element 200 is electrically connected to the second potential supply terminal 222 and a second terminal thereof (a terminal on a cathode side) is electrically connected to one of a source terminal and a drain terminal of the first transistor 211.

In the amplifier circuit 201, a gate terminal of the first transistor 211 is electrically connected to the other of the source terminal and the drain terminal of the first transistor 211 and the one of the source terminal and the drain terminal thereof is electrically connected to the first potential supply terminal 221. A gate terminal of the second transistor 212 is electrically connected to the gate terminal of the first transistor 211 and one of a source terminal and a drain terminal of the second transistor 212 is electrically connected to the third potential supply terminal 223 and the other of the source terminal and the drain terminal of the second transistor 212 is electrically connected to the charge/discharge circuit 101 via the first switching element 111. At this time, the first transistor 211 and the second transistor 212 are p-channel transistors.

A power supply potential is applied to the photoelectric conversion circuit 100 illustrated in FIG. 4 via the first potential supply terminal 221 and the third potential supply terminal 223 and a ground potential is applied to the photoelectric conversion circuit 100 via the second potential supply terminal 222.

Next, the operation of the photoelectric conversion circuit 100 illustrated in FIG. 4 is described.

When the photoelectric conversion element 200 receives light, photocurrent corresponding to the illuminance of the light received is generated in the photoelectric conversion element 200. Then, in accordance with the photocurrent, the first transistor 211 is turned on, so that current flows between the source terminal and the drain terminal of the first transistor 211. Further, in accordance with the photocurrent, the second transistor 212 is turned on, so that current (also called the amplified current) obtained by amplifying the photocurrent flows as the first current between the source terminal and the drain terminal of the second transistor 212. This is the operation performed in the photoelectric conversion circuit 100.

Next, the structure of the charge/discharge circuit 101 is described.

The charge/discharge circuit 101 includes N (N is a natural number of 2 or more) pieces of capacitors and N−1 pieces of third switching elements.

Among the N pieces of capacitors, a first terminal of the first capacitor is electrically connected to the photoelectric conversion circuit 100 via the first switching element 111. That is, the first switching element 111 is turned on or off so as to control the conduction between the first terminal of the first capacitor and the photoelectric conversion circuit 100.

Among the N pieces of capacitors, a first terminal of the K-th ($2 \leq K \leq N$, K is a natural number) capacitor is electrically connected to a first terminal of the (K−1)-th capacitor via the (K−1)-th third switching element. That is, the (K−1)-th third switching element is turned on or off so as to control the conduction between the first terminal of K-th capacitor and the first terminal of the (K−1)-th capacitor.

The N−1 pieces of third switching elements are turned on at desired time, in order from the first third switching element in accordance with the amount of the first current generated in the photoelectric conversion circuit 100.

In the example illustrated in FIG. 3, the photoelectric conversion device includes the charge/discharge circuit 101 which includes a first capacitor 141, a second capacitor 142, and a third switching element 113.

A first terminal of the first capacitor 141 is electrically connected to the second input terminal of the comparator 103 and a second terminal of the first capacitor 141 is grounded.

Further, a first terminal of the second capacitor 142 is electrically connected to the first terminal of the first capacitor 141 and a second terminal of the second capacitor 142 is grounded.

The third switching element 113 is turned on or off in accordance with the first current so as to control the conduction between the first terminal of the first capacitor 141 and the first terminal of the second capacitor 142. The third switching element 113 is preferably turned on at desired time. The time when the third switching element 113 is turned on can be set by, for example, the provision of a comparison circuit. An example of the structure of the comparison circuit is illustrated in FIG. 5.

Figure 5:
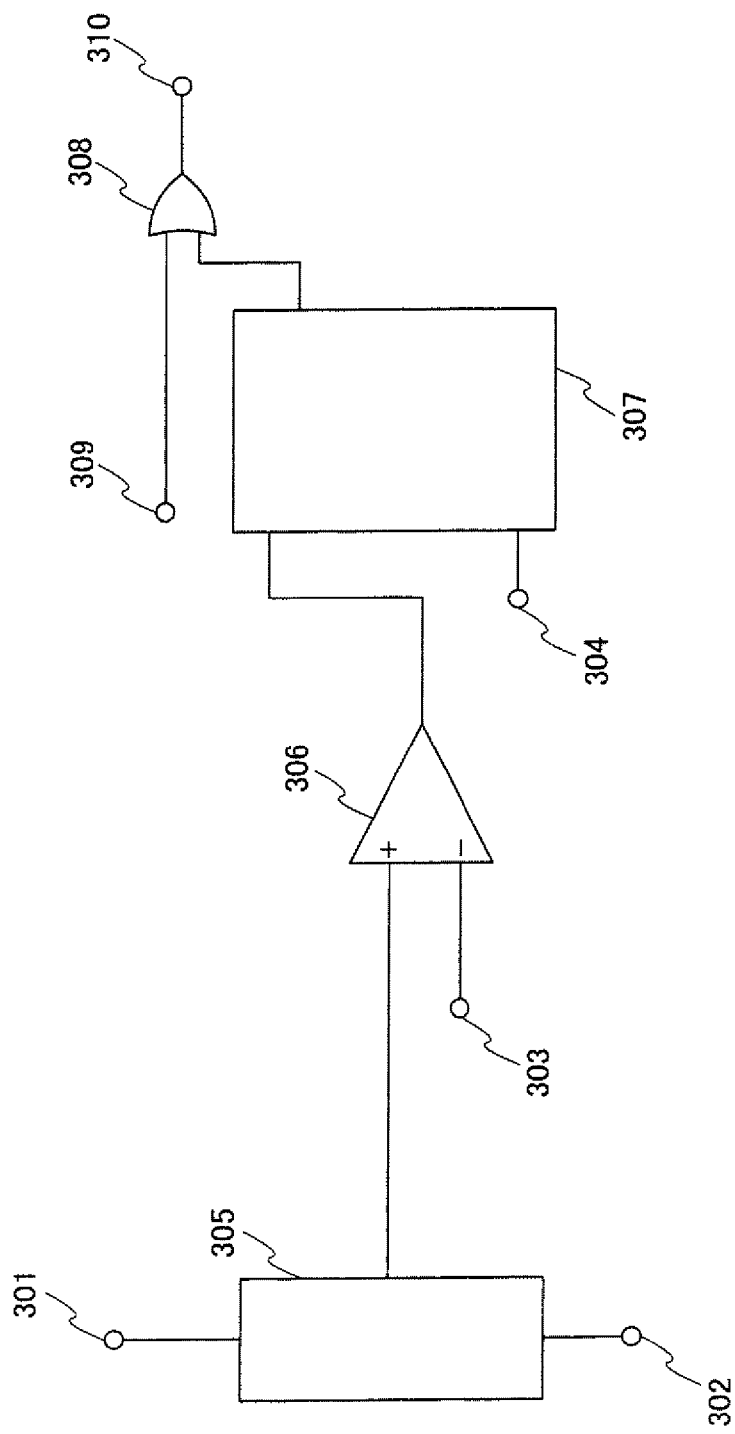
FIG. 5 is a circuit diagram which illustrates an example of a circuit configuration of a comparison circuit of the photoelectric conversion device in Embodiment 1.

The comparison circuit illustrated in FIG. 5 includes a first potential supply terminal 301, a second potential supply terminal 302, a third potential supply terminal 303, a fourth potential supply terminal 304, a voltage divider circuit 305, a comparator 306, a latch circuit 307, an OR circuit 308, a fifth potential supply terminal 309, and an output terminal 310.

The voltage divider circuit 305 has a function of dividing the voltage corresponding to the difference between the potential applied via the first potential supply terminal 301 and the potential applied via the second potential supply terminal 302.

The comparator 306 includes a first input terminal, a second input terminal, and an output terminal, and has a function of comparing the potential corresponding to the voltage input to the first input terminal thereof and divided by the voltage divider circuit 305 (also called a divided potential or a second reference potential) with the potential input to the second input terminal thereof via the third potential supply terminal 303 and outputting an output signal of the potential corresponding to the result of the comparison. The potential input via the third potential supply terminal 303 corresponds to the potential of the node 106 in the photoelectric conversion device illustrated in FIG. 3. Note that the potential of the divided voltage is set at a given value depending on the electrical capacitance of the first capacitor 141.

The latch circuit 307 includes a first input terminal a second input terminal, and an output terminal, and has a function of holding the value (potential) of the output signal of the comparator 306 which is input to the first terminal of the latch circuit 307. While the value of the output signal of the comparator 306 is held, the potential of an output signal of the latch circuit 307 is equal to the potential of the input signal input to the first input terminal of the latch circuit 307. When a first reset potential is applied to the second input terminal of the latch circuit 307 via the fourth potential supply terminal 304, the value of the signal held in the latch circuit 307 is reset.

The OR circuit 308 outputs a signal in a high state to the output terminal 310 when the signal input from the latch circuit 307 is in a high state or when a second reset potential is applied via the fifth potential supply terminal 309.

The comparison circuit illustrated in FIG. 5 outputs an output signal of the OR circuit 308 via the output terminal 310. At this time, the output signal serves as a control signal of the third switching element 113 in FIG. 3; for example, when the output signal is in a high state, the third switching element 113 is turned on and when the output signal is in a low state, the third switching element 113 is turned off.

By the provision of the comparison circuit with the structure as above, for example, switching of connections between the plurality of capacitors can be performed.

The current circuit 102 includes a current source 150. A first terminal of the current source 150 is electrically connected to the first terminal of the first capacitor 141 in the charge/discharge circuit 101 via the second switching element 112 and a second terminal of the current source 150 is grounded. That is to say, the second switching element 112 has a function of controlling conduction between the first terminal of the current source 150 and the first terminal of the first capacitor 141. At this time, the second current flows from the first terminal to the second terminal.

The photoelectric conversion device illustrated in FIG. 3 includes a fourth switching element 114. The second input terminal of the comparator 103 is electrically connected to the output terminal via the fourth switching element 114. That is, the fourth switching element 114 has a function of controlling the conduction between the output terminal and the second input terminal of the comparator 103. As the fourth switching element 114, any of the switching elements similar to the switching elements which can be used as the first switching element 111 to the third switching element 113 can be used.

Figure 6:
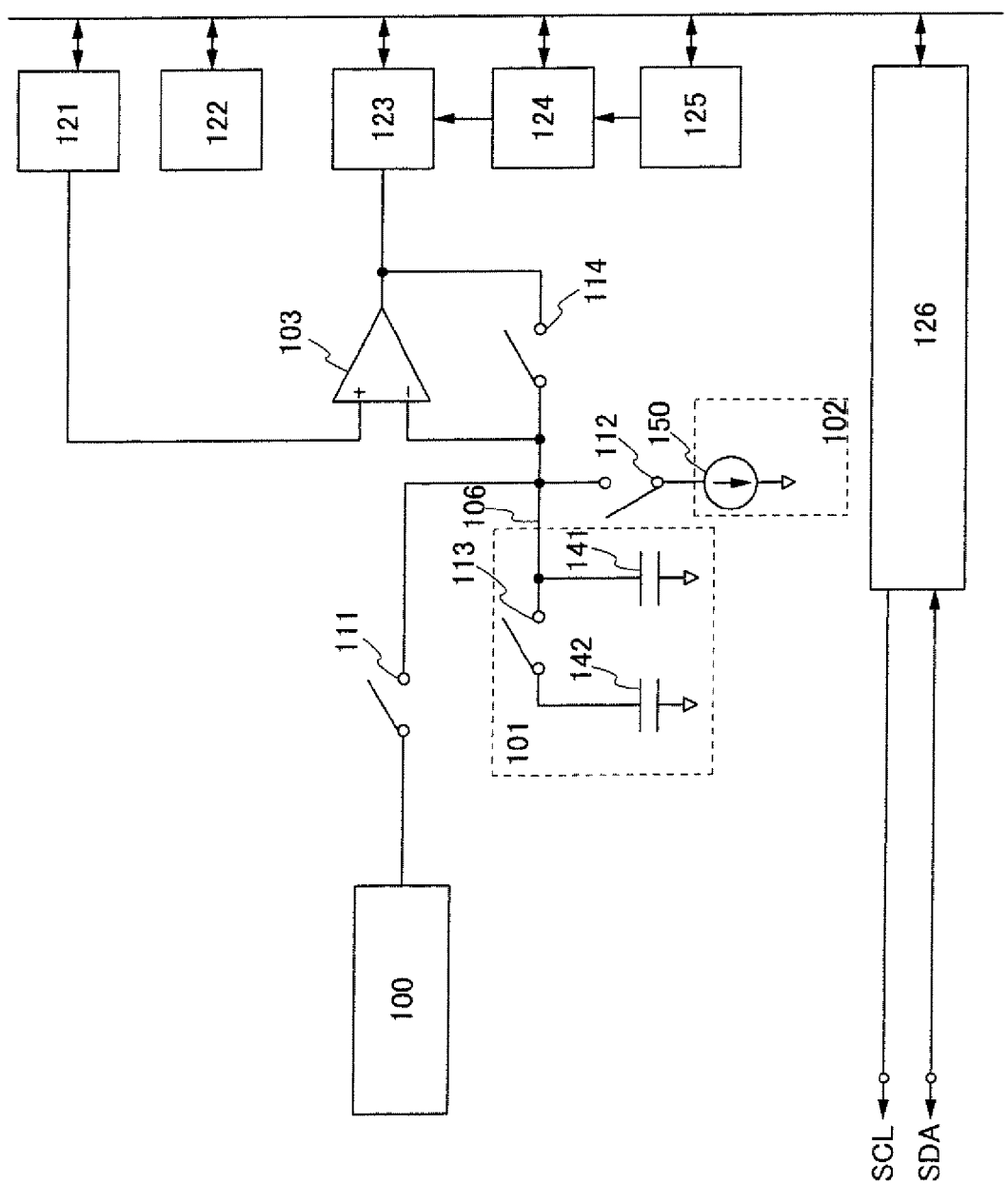
FIG. 6 is a circuit diagram which illustrates an example of a circuit configuration of the photoelectric conversion device in Embodiment 1.

FIG. 6 illustrates the circuit configuration of the photoelectric conversion device illustrated in FIG. 3 which further includes a circuit for converting a signal generated in accordance with the illuminance of the incident light into a digital signal. FIG. 6 is a circuit diagram of an example of the photoelectric conversion device of Embodiment 1.

The photoelectric conversion device illustrated in FIG. 6 includes a constant voltage circuit 121 (also called a regulator), a control circuit 122, a latch circuit 123, a counter circuit 124, a clock signal generating circuit 125, and an interface circuit 126, in addition to the circuit configuration of the photoelectric conversion device illustrated in FIG. 3.

The constant voltage circuit 121 has a function of generating a voltage at a constant level (also called a constant voltage). The constant voltage generated is output as, for example, a reference potential. The constant voltage circuit 121 can output a potential (also called a power supply potential) for driving a circuit to the control circuit 122, the latch circuit 123, the counter circuit 124, the clock signal generating circuit 125, or the interface circuit 126 as necessary.

The control circuit 122 has a function of controlling the time when the switching element in the photoelectric conversion device of Embodiment 1 is turned on or off, and has a function of generating a signal (also called a reset signal) for resetting any of the photoelectric conversion devices of Embodiment 1. The control circuit 122 can synchronize each signal of the latch circuit 123, the counter circuit 124, the clock signal generating circuit 125, or the interface circuit 126.

The latch circuit 123 is electrically connected to the output terminal of the comparator 103 (the output terminal 105 illustrated in FIG. 3) and has a function of holding the count value output from the counter circuit 124 in accordance with the output signal of the comparator 103. The count value held in the latch circuit 123 is output as a digital signal to the interface circuit 126.

Moreover, the counter circuit 124 has a function of counting an edge of a clock signal (also called CLK) output from the clock signal generating circuit 125. The edge refers to the point at which the signal is switched from a high state to a low state or from a low state to a high state, for example. Furthermore, the counter circuit 124 outputs a signal with a potential corresponding to the number counted (also called the count value or CNT) to the latch circuit 123. Note that the count value is output to the latch circuit 123 as a digital signal at the number of buses which corresponds to the number that can be counted (called the number of bits).

The clock signal generating circuit 125 has a function of outputting, to the counter circuit 124, the clock signal which is counted by the counter circuit 124. For the clock signal generating circuit 125, for example, an oscillation circuit including a solid state vibrator, a CR oscillation circuit, or the like can be used.

As the interface circuit 126, for example, I$^2$C (inter integrated circuit) interface, which is one of serial digital interfaces, can be used. The I$^2$C interface is connected to an external device by an I$^2$C bus which includes a serial data line (SDA) for data communication with another device and a serial clock line (SCL) for control and synchronization of data communication with another device. In a circuit connected to the I$^2$C interface, response or nonresponse is selected depending on a unique address, whereby intercircuit data communication can be performed. As an alternative to the I$^2$C bus, another bus standard such as universal serial bus or serial peripheral interface can be used. This is the description of the structure of the photoelectric conversion device illustrated in FIG. 6.

Figure 7:
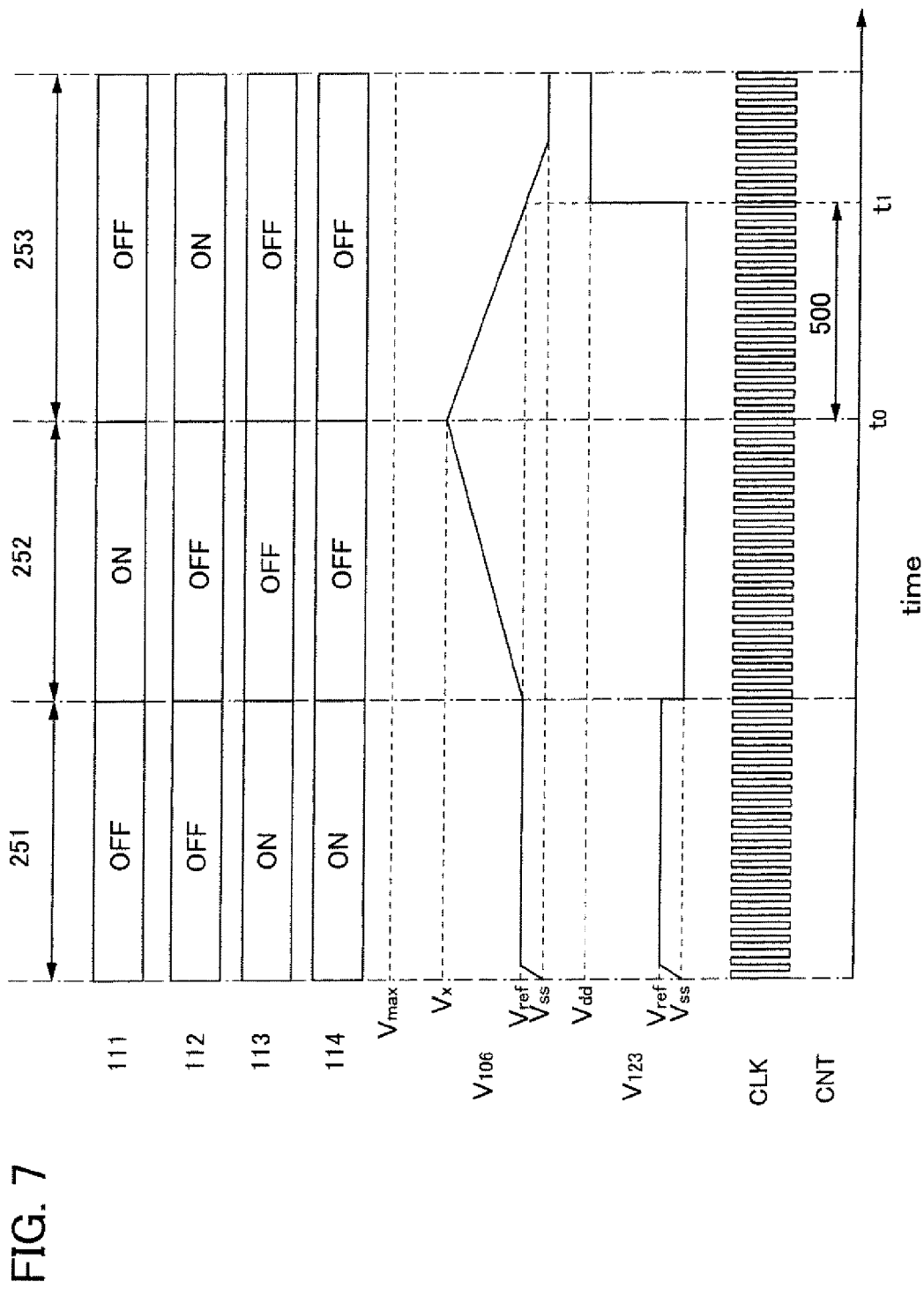
FIG. 7 is a timing chart of the operation of the photoelectric conversion device illustrated in FIG. 6.
Figure 8:
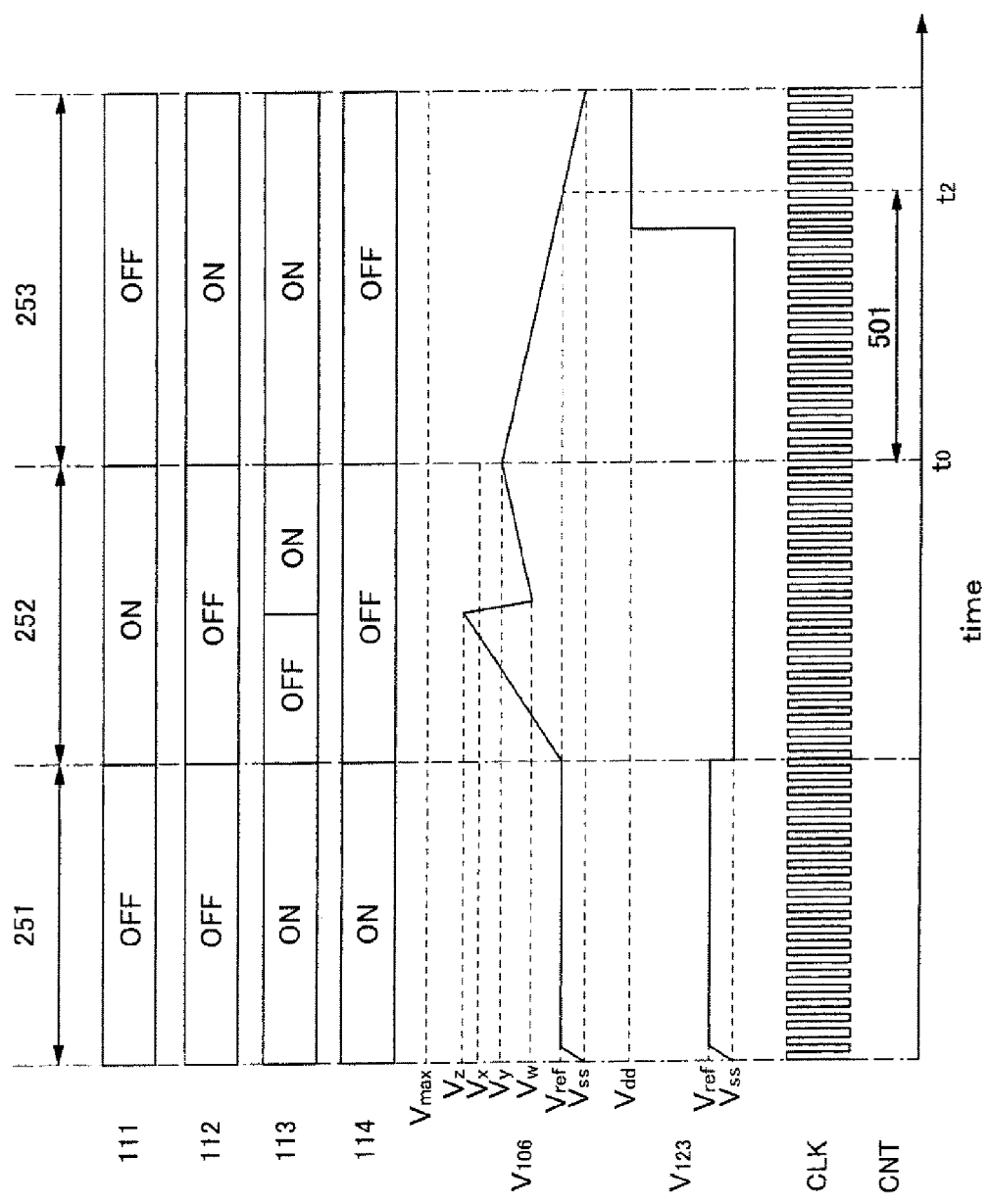
FIG. 8 is a timing chart of the operation of the photoelectric conversion device illustrated in FIG. 6.

Next, the operation of the photoelectric conversion device illustrated in FIG. 6 is described with FIG. 7 and FIG. 8. FIG. 7 and FIG. 8 are timing charts which show the operation of the photoelectric conversion device of Embodiment 1 illustrated in FIG. 6. Embodiment 1 describes the case where the $I_L$ generated by the photoelectric conversion circuit 100 is smaller than the $I_{ref}$ and the case where the $I_L$ is larger than the $I_{ref}$. Note that the $I_{ref}$ is a given value set in consideration of the electrical capacitance of the charge/discharge circuit 101.

As FIG. 7 and FIG. 8 indicate, the operation of the photoelectric conversion device illustrated in FIG. 6 is divided into a first period 251, a second period 252, and a third period 253.

First, the case where the $I_L$ is smaller than the $I_{ref}$ is described with reference to FIG. 7.

As FIG. 7 indicates, in the first period 251, the first switching element 111 and the second switching element 112 are off and the third switching element 113 and the fourth switching element 114 are on.

At this time, the second input terminal and the output terminal of the comparator 103 are electrically connected to each other, so that the potential of the node 106 (also called $V_{106}$) becomes the $V_{ref}$ and the potentials of the first terminals of the first capacitor 141 and the second capacitor 142 also become the $V_{ref}$.

Further, the potential (also called $V_{123}$) of the signal input to the latch circuit 123 becomes the $V_{ref}$ at this time. This is the operation performed in the first period 251. In fact, the $V_{123}$ is the value obtained by subtracting the offset potential of the comparator 103 from the $V_{ref}$. Therefore, even in the case where the offset potential of the comparator 103 changes over time, the input/output signals of the comparator 103 can be corrected by the provision of the third switching element 113. In the description of Embodiment 1, it is assumed that the $V_{123}$ becomes the $V_{ref}$ for convenience.

Next, in the second period 252, the first switching element 111 is on and the third switching element 113 and the fourth switching element 114 are off. The second switching element 112 remains off.

At this time, electric charge is accumulated in the charge/discharge circuit 101 in accordance with the amount of the first current generated in the photoelectric conversion circuit 100. At this time, the $V_{106}$ increases up to $V_x$. The $V_x$ is a given value that is higher than $V_{ss}$ and lower than the potential $V_{max}$ at which the electric charge is accumulated as much as possible in the charge/discharge circuit 101.

Further, at this time, the $V_{123}$ is the $V_{ss}$ because the $V_{106}$ is higher than the $V_{ref}$ and the output signal of the comparator 103 has the $V_{ss}$. This is the operation performed in the second period 252.

Next, in the third period 253, the first switching element 111 is off and the second switching element 112 is on. The third switching element 113 and the fourth switching element 114 remain off.

At this time, since the second current flows from the first terminal to the second terminal in the current circuit 102, the electric charge accumulated in the charge/discharge circuit 101 is released for every constant amount. At this time, the $V_{106}$ decreases to become the $V_{ref}$ at the time $t_1$ and then become the $V_{ss}$. The length of time for which the $V_{106}$ decreases from the $V_x$ to the $V_{ref}$ (also called a discharge time) differs depending on the amount of electric charge accumulated in the charge/discharge circuit 101. The amount of electric charge accumulated in the charge/discharge circuit 101 differs depending on the electrical capacitance of the charge/discharge circuit 101 or the amount of the first current generated by the photoelectric conversion circuit 100.

In the counter circuit 124, at the time when the second switching element 112 is turned on, the count value is reset, and then the edge of the clock signal is counted (also called counted-up). The time at this point is expressed as $t_0$. After that, when the potential of the $V_{106}$ decreases to become the $V_{ref}$ at the time $t_1$, the potential of the output signal of the comparator 103 becomes the $V_{dd}$. Accordingly, when the signal with the $V_{dd}$ is input to the latch circuit 123, the signal with the potential based on a first count value 500 from the time $t_0$ to the time $t_1$ is held in the latch circuit 123 and a digital signal is generated by the interface circuit 126 in accordance with the value held. This is the operation performed in the third period 253.

The amount of the second current ($i_0$) of the current circuit 102 in the third period 253 is preferably set as $i_0$=($t_0$×the amount of the first current corresponding to one count value)/ (0.5 cycle of time of the clock signal in the clock signal generating circuit 125). Accordingly, the comparison between the potentials in the comparator 103 can be performed more accurately.

Next, the case where the $I_L$ is larger than the $I_{ref}$ is described with reference to FIG. 8.

As FIG. 8 indicates, since the operation in the first period 251 is the same as that in the case where the $I_L$ is smaller than the $I_{ref}$, the description in that case is referred to.

Next in the second period 252, the first switching element 111 is on and the fourth switching element 114 is off. The second switching element 112 remains off. Moreover, the third switching element 113 remains off in a certain period in the second period 252.

At this time, electric charge is accumulated in the charge/discharge circuit 101 in accordance with the amount of the first current generated in the photoelectric conversion circuit 100. In this case, when the $V_{106}$ increases up to $V_z$, the third switching element 113 is turned on. Note that the $V_z$ is a given value that is higher than the $V_{ss}$ and lower than the $V_{max}$ at which the electric charge is accumulated as much as possible in the charge/discharge circuit 101; for example, the value can be set by the comparison circuit illustrated in FIG. 5.

Further, when the third switching element 113 is turned on, the first capacitor 141 and the second capacitor 142 are capacitively coupled; then, the $V_{106}$ decreases from the $V_z$ to $V_w$. At this time, when the electrical capacitance of the first capacitor 141 is expressed as $C_1$ and that of the second capacitor is expressed as $C_2$, $V_w=(C_1V_z+C_2V_{ref})/(C_1+C_2)$. That is, the $V_w$ is a given value that is set by setting the electrical capacitance of the first capacitor 141 and the second capacitor 142.

Further, the $V_{106}$ increases again from the $V_w$ to the $V_y$. The $V_y$ is a given value that is higher than $V_{ss}$ and lower than the $V_{max}$.

Moreover, the $V_{123}$ is the $V_{ss}$ because the $V_{106}$ is higher than the $V_{ref}$ and the output signal of the comparator 103 has the $V_{ss}$. This is the operation performed in the second period 252.

Next, in the third period 253, the first switching element 111 is off and the second switching element 112 is on. The third switching element 113 remains on and the fourth switching element 114 remains off.

At this time, since the second current flows from the first terminal to the second terminal in the current circuit 102, the electric charge is released for every constant amount. At this time, the $V_{106}$ decreases to become the $V_{ref}$ at the time $t_1$ and then become the $V_{ss}$. The length of time for which the $V_{106}$ decreases from the $V_x$ to the $V_{ref}$ (also called a discharge time) differs depending on the amount of electric charge accumulated in the charge/discharge circuit 101. The amount of electric charge accumulated in the charge/discharge circuit 101 differs depending on the electrical capacitance of the charge/discharge circuit 101 or the amount of the first current generated by the photoelectric conversion circuit 100.

In the counter circuit 124, at the time when the second switching element 112 is turned on, the count value is reset, and then the edge of the clock signal is counted up. The time at this point is expressed as $t_0$. After that, when the potential of the $V_{106}$ decreases to become the $V_{ref}$ at the time $t_2$, the potential of the output signal of the comparator 103 becomes the $V_{dd}$. When the signal with the $V_{dd}$ is input to the latch circuit 123, the signal with the potential based on a second count value 501 from the time $t_0$ to the time $t_2$ is held in the latch circuit 123 and a digital signal is generated by the interface circuit 126 in accordance with the value held. This is the operation performed in the third period 253.

Figure 9:
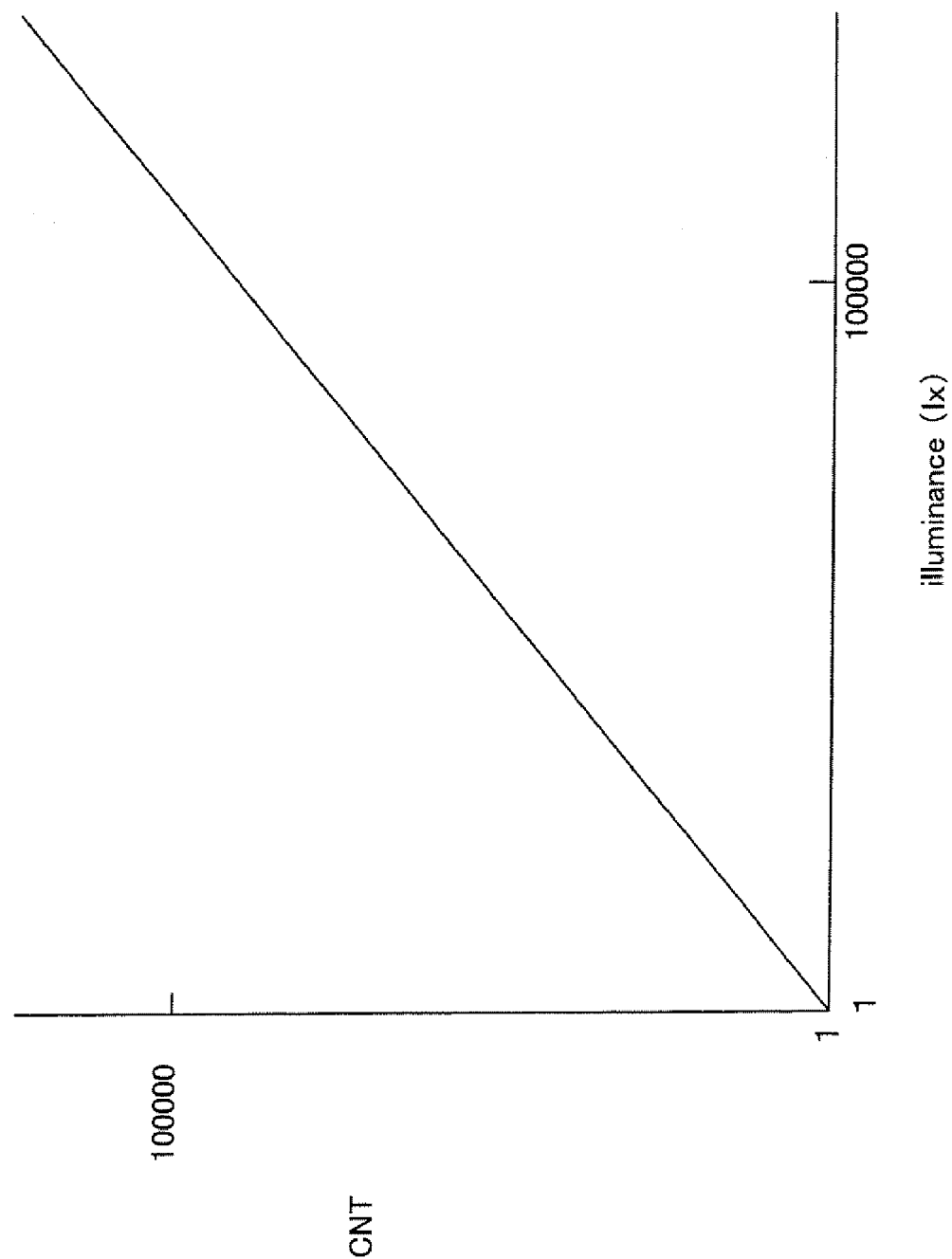
FIG. 9 is a graph which shows the relationship between illuminance of incident light and count values of a counter circuit.

FIG. 9 is a graph of the relationship between the illuminance of light entering the photoelectric conversion circuit 100 and the count value of the counter circuit 124. As FIG. 9 indicates, the higher the illuminance is, the larger the count value becomes in the photoelectric conversion device described in Embodiment 1. Therefore, the illuminance of the incident light can be detected by the count value, so that the illuminance of light can be detected with high accuracy. Further, the photoelectric conversion device of Embodiment 1 can use a count value of, for example, 10 bits or more; therefore, the resolution to the illuminance of light in the photoelectric conversion can be improved.

The discharge time of the charge/discharge circuit in the photoelectric conversion device of Embodiment 1 was examined by calculation. The details are described below.

First, a conventional photoelectric conversion device which has the same structure as the photoelectric conversion device illustrated in FIG. 3 except that the capacitor 142 is not provided is considered. In this case, a reference potential $V_0$ is applied to the second input terminal of the comparator 103 via the potential supply terminal 104. Note that the operation of the conventional photoelectric conversion device is described using the timing chart of FIG. 7 as appropriate.

First, in the second period 252, if the capacitance of the charge/discharge circuit 101 is expressed as $C_0$, $C_0$ is equal to $C_{141}$ (the capacitance of the capacitor 141), and the capacitor 141 is charged for a certain period of time $T_0$ with current based on the photocurrent of the photoelectric conversion element 200, then the voltage (also called $V(L_x)$) of the node 106 can be expressed as the formula 1 below. In this formula, $Q(L_x)$ represents the electric charge which is charged in the charge/discharge circuit with current based on the photocurrent.

$$V(L_x) = \frac{Q(L_x)}{C_0} + V_0$$

Here, it is assumed that the potential of the node 106 is set at $V_0$ and the electric charge of $Q(L_x)$ is charged in the charge/discharge circuit 101 with current based on the photocurrent. After that the charge/discharge circuit 101 charged by the current circuit 102 in the third period 253 discharges the electric charge at the constant current $I_0$. Here, the discharge time $T_{mea}^{(c)}$ until the output of the comparator 103 is inverted can be represented by the formula 2 below.

$$T_{mea}^{(c)} = \frac{Q(L_x)}{I_0}$$

However, actual photoelectric conversion devices are affected by noise. Some noise depends on the capacitance $C_0$ or the like; however, only the noise that does not depend on the capacitance is considered here for simplicity. If the voltage of this noise is expressed as $V_n$, the discharge time $T_{mea}^{(c)}$ in the actual photoelectric conversion device in the conventional example can be represented by the formula 3 below.

$$T_{mea}^{(c)} = \frac{Q(L_x) - C_0 V_n}{I_0} = T_{mea}^{(c)} - \frac{C_0 V_n}{I_0}$$

Next, the photoelectric conversion device illustrated in FIG. 3 as an example of the photoelectric conversion device according to an embodiment of the present invention is considered. When $C_0 = C_{141} + C_{142}$ ($C_{142}$ is the capacitance of the capacitor 142) and the third switching element 113 is turned on at the illuminance that is higher than a certain value, the results are the same as those in the conventional example. Here, the case where the third switching element 113 remains off at the illuminance that is lower than the certain value is considered. The discharge time in this case can be represented by the formula 4 below.

$$T_{mea}^{(c)} = \frac{Q(L_x) - C_1 V_n}{I_0} = T_{mea}^{(c)} - \frac{C_1 V_n}{I_0}$$

In this case, since the $C_{141}$ is smaller than the $C_0$, it is understood that deviation due to the noise is smaller in the photoelectric conversion device according to an embodiment of the present invention than in the conventional example.

Accordingly, in the photoelectric conversion device which is an embodiment of the present invention, the amount of discharge per unit time is larger than that of the conventional photoelectric conversion device; therefore, the deviation from the ideal count value can be reduced in the photoelectric conversion device according to an embodiment of the present invention as compared with the conventional photoelectric conversion device. Thus, the results of the examination also indicate that the resolution is improved.

As described thus, the electric charge can be accumulated in accordance with the amount of the first current in the charge/discharge circuit in such a manner that the amount of the electric charge which corresponds to the amount of the first current does not exceed the upper limit of accumulation of the charge/discharge circuit by changing the electrical capacitance of the charge/discharge circuit in accordance with the amount of the first current generated in the photoelectric conversion circuit, that is, in accordance with the illuminance of the incident light. Therefore, the resolution to the illuminance of the light in the photoelectric conversion can be improved.

Note that Embodiment 1 can be combined with any of the other embodiments as appropriate.

Embodiment 2

In Embodiment 2, a photoelectric conversion device with a different structure from that of the photoelectric conversion device of Embodiment 1 is described as a photoelectric conversion device according to an embodiment of the present invention.

Figure 10:
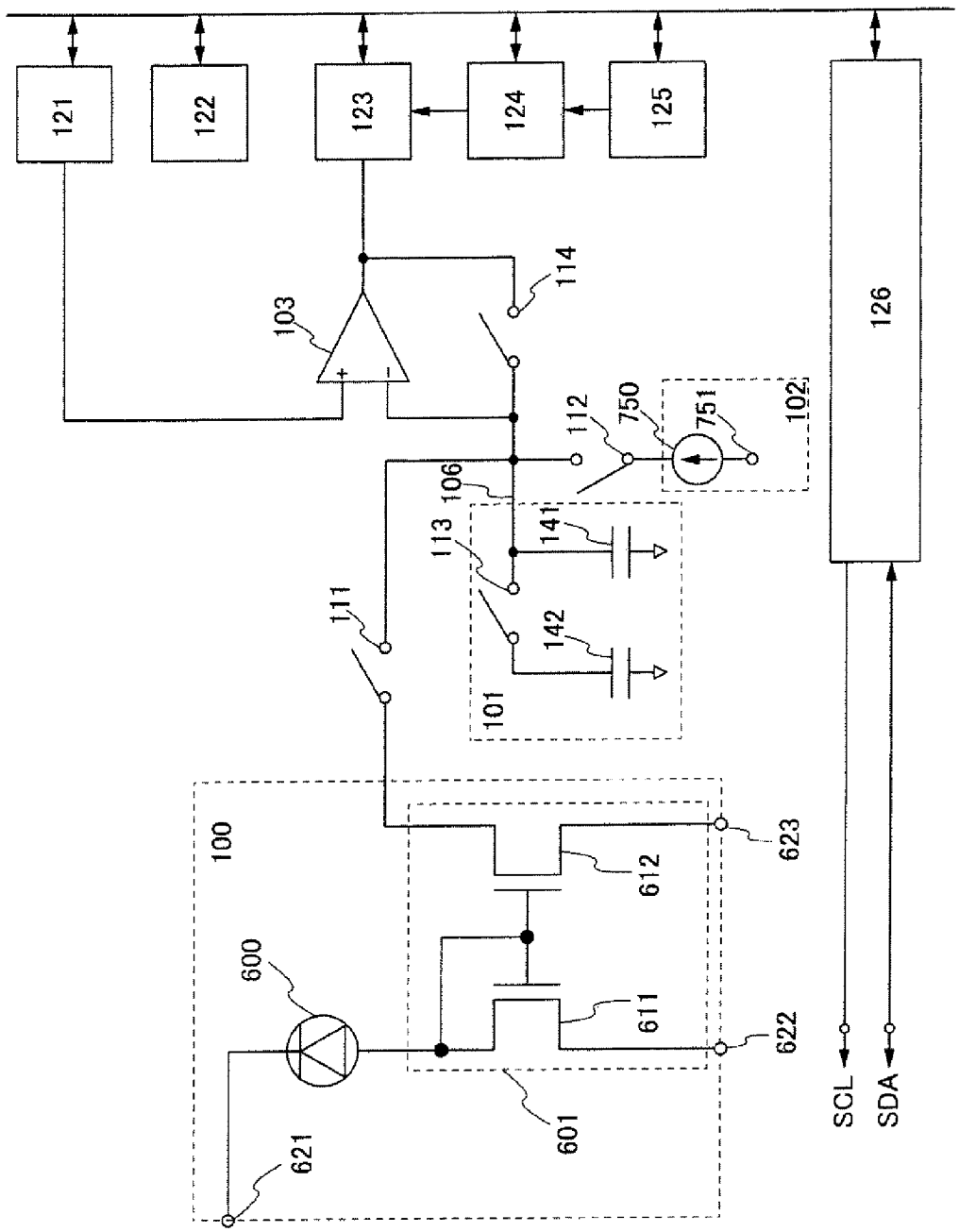
FIG. 10 is a circuit diagram which illustrates an example of a circuit configuration of a photoelectric conversion device in Embodiment 2.

First, the structure of the photoelectric conversion device of Embodiment 2 is described with reference to FIG. 10. FIG. 10 is a circuit diagram which illustrates an example of the structure of the photoelectric conversion device in Embodiment 2.

The photoelectric conversion device illustrated in FIG. 10 includes the photoelectric conversion circuit 100, the charge/discharge circuit 101, the current circuit 102, the comparator 103, the first switching element 111, the second switching element 112, the fourth switching element 114, the constant voltage circuit 121, the control circuit 122, the latch circuit 123, the counter circuit 124, the clock signal generating circuit 125, and the interface circuit 126.

Further, the charge/discharge circuit 101 includes the first capacitor 141, the second capacitor 142, and the third switching element 113.

As for the parts in the photoelectric conversion device in FIG. 10 which are denoted with the same reference numerals as the elements and circuits in the photoelectric conversion device in FIG. 3, the description of the elements and circuits of the photoelectric conversion device in FIG. 3 is referred to as appropriate for convenience and the description of the same parts in the photoelectric conversion device in FIG. 10 is not made.

The photoelectric conversion circuit 100 includes a photoelectric conversion element 600 and an amplifier circuit 601.

The photoelectric conversion element 600 has a function of generating photocurrent corresponding to the illuminance of incident light.

The amplifier circuit 601 has a function of amplifying the amount of photocurrent generated by the photoelectric conversion element 600.

The amplifier circuit 601 is formed using a current mirror circuit including a first transistor 611 serving as a reference transistor and a second transistor 612 serving as an output transistor. Although FIG. 10 illustrates the example in which the current mirror circuit includes the first transistor 611 and the second transistor 612, there is no particular limitation to this. A plurality of the first transistors 611 and a plurality of the second transistor 612 may be provided alternatively.

A first terminal (a terminal on an anode side) of the photoelectric conversion element 600 is electrically connected to one of a source terminal and a drain terminal of the first transistor 611 and a second terminal (a terminal on a cathode side) of the photoelectric conversion element 600 is electrically connected to a first potential supply terminal 621.

In the amplifier circuit 601, a gate terminal of the first transistor 611 is electrically connected to the one of the source terminal and the drain terminal of the first transistor 611 and the other of the source terminal and the drain terminal of the first transistor 611 is electrically connected to a second potential supply terminal 622. A gate terminal of the second transistor 612 is electrically connected to the gate terminal of the first transistor 611, one of a source terminal and a drain terminal of the second transistor 612 is electrically connected to the charge/discharge circuit 101 via the first switching element 111, and the other of the source terminal and the drain terminal of the second transistor 612 is electrically connected to a third potential supply terminal 623. At this time, the first transistor 611 and the second transistor 612 are n-channel transistors.

A power supply potential is applied to the photoelectric conversion circuit 100 via the first potential supply terminal 621 and a ground potential is applied to the photoelectric conversion circuit 100 via the second potential supply terminal 622 and the third potential supply terminal 623.

Next, the operation of the photoelectric conversion circuit 100 in the photoelectric conversion device of FIG. 10 is described.

When the photoelectric conversion element 600 receives light, photocurrent corresponding to the illuminance of the light received is generated in the photoelectric conversion element 600. In accordance with the photocurrent, the first transistor 611 is turned on, whereby current flows between the source terminal and the drain terminal of the first transistor 611. Moreover, in accordance with the photocurrent, the second transistor is turned on and the first current flows between the source terminal and the drain terminal of the second transistor 612. This is the operation of the photoelectric conversion circuit 100 in the photoelectric conversion device illustrated in FIG. 10.

The current circuit 102 has a function of generating a constant amount of the second current, and when the second switching element 112 is turned on, the second current flows to the current circuit 102, whereby the electric charge is accumulated in the charge/discharge circuit 101 in accordance with the second current. More specifically, the current circuit 102 includes a current source 750 and a potential supply terminal 751, and a first terminal of the current source 750 is electrically connected to the first terminal of the first capacitor 141 in the charge/discharge circuit 101 via the second switching element 112 and a second terminal of the current source 750 is electrically connected to the potential supply terminal 751. A power supply potential is applied to the potential supply terminal 751. At this time, the second current flows from the second terminal to the first terminal.

Figure 11:
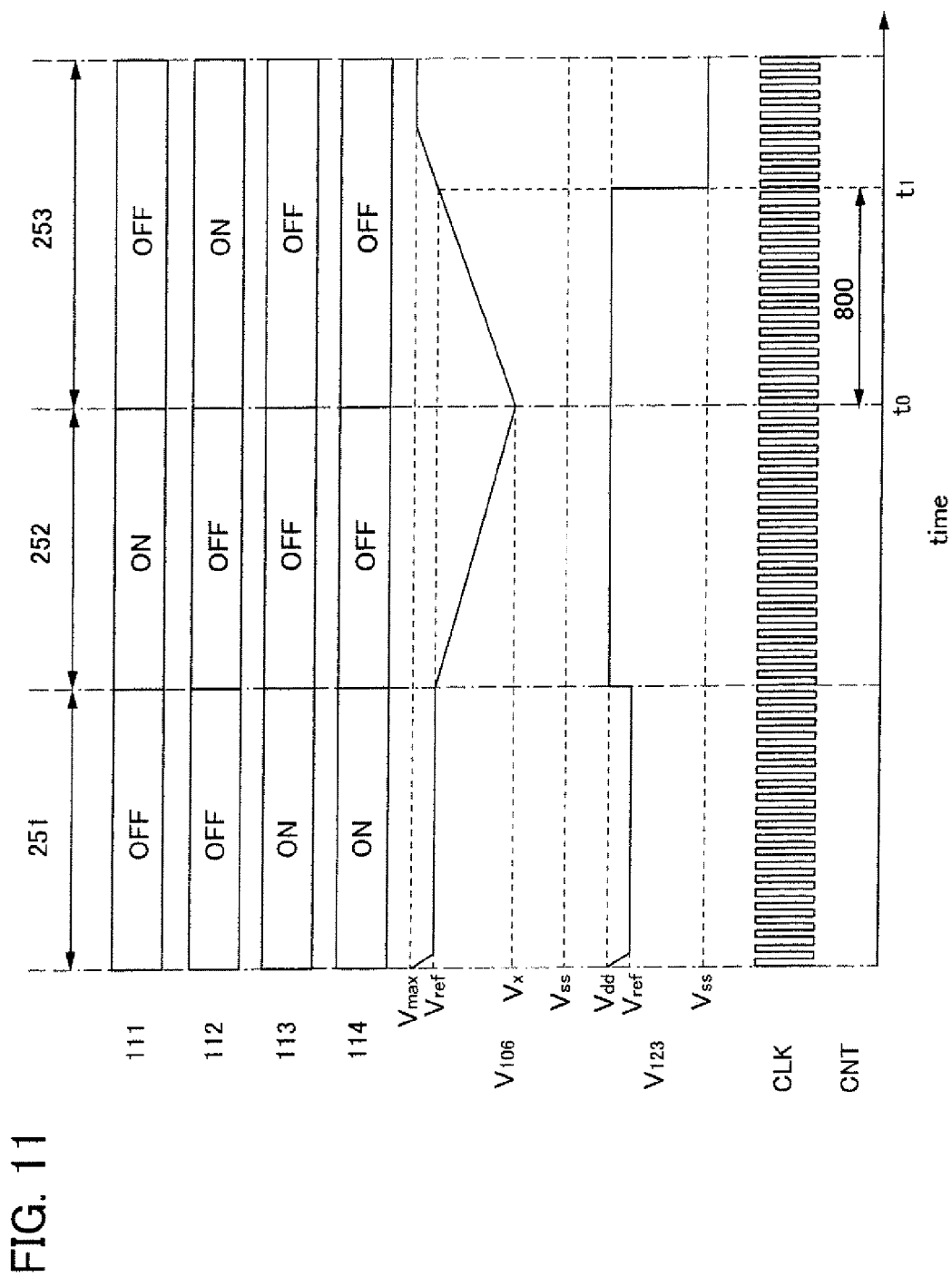
FIG. 11 is a timing chart of the operation of the photoelectric conversion device illustrated in FIG. 10.
Figure 12:
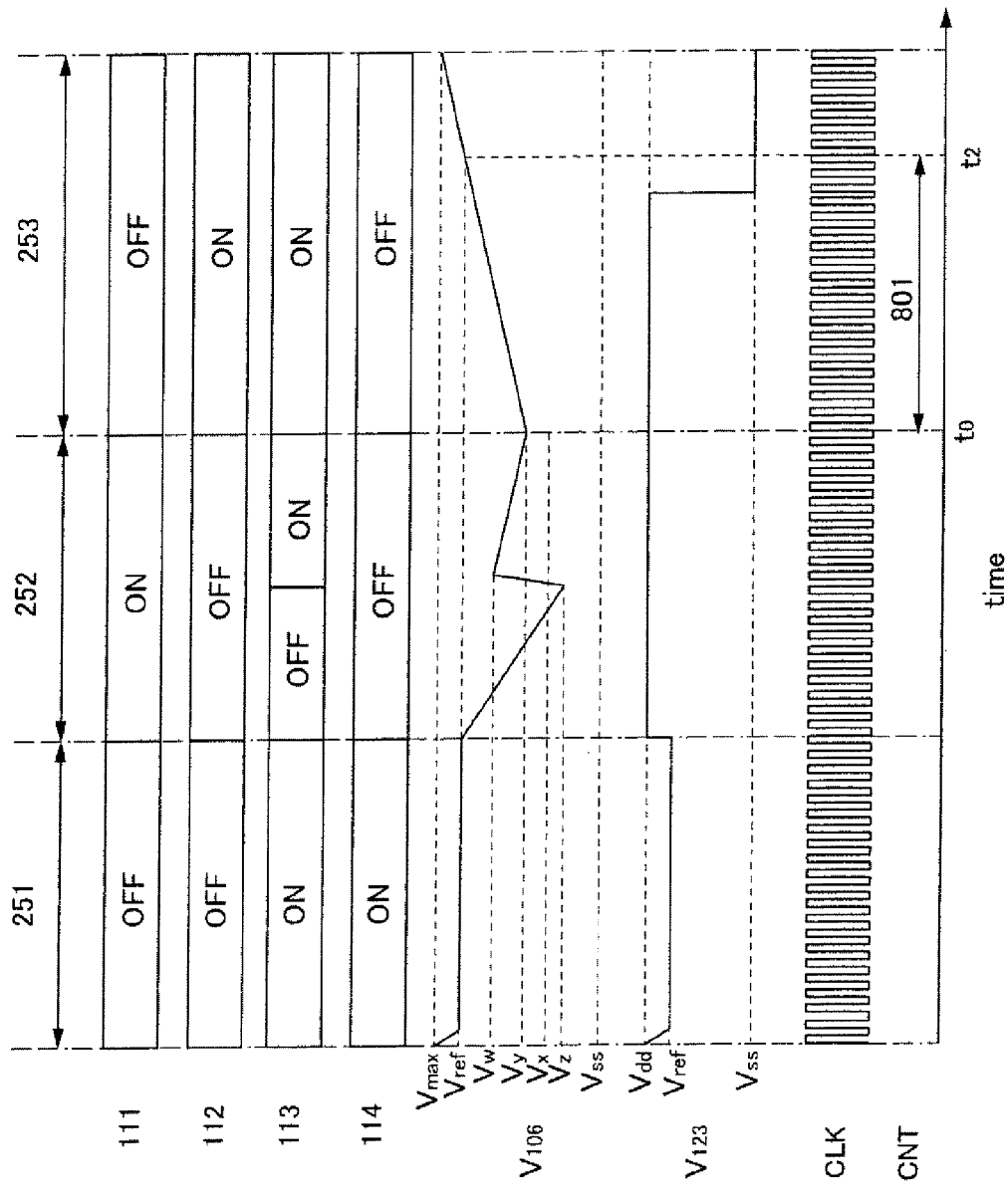
FIG. 12 is a timing chart of the operation of the photoelectric conversion device illustrated in FIG. 10.

Next, the operation of the photoelectric conversion device of FIG. 10 is described with reference to FIG. 11 and FIG. 12. Each of the FIG. 11 and FIG. 12 is a timing chart of the operation of the photoelectric conversion device illustrated in FIG. 10. Here, the case where the $I_L$ generated by the photoelectric conversion circuit 100 is smaller than the $I_{ref}$ and the case where the $I_L$ generated by the photoelectric conversion circuit 100 is larger than the $I_{ref}$ are described. Note that the $I_{ref}$ is a given value set in consideration of the electrical capacitance of the charge/discharge circuit 101.

As FIG. 11 and FIG. 12 indicate, the operation of the photoelectric conversion device illustrated in FIG. 10 is divided into the first period 251, the second period 252, and the third period 253.

First, the case where the $I_L$ is smaller than the $I_{ref}$ is described.

As FIG. 11 indicates, in the first period 251, the first switching element 111 and the second switching element 112 are off and the third switching element 113 and the fourth switching element 114 are on.

At this time, the output terminal and the second input terminal of the comparator 103 are electrically connected to each other, the potential of the node 106 (also called $V_{106}$) becomes the $V_{ref}$, and the potentials of the first terminals of the first capacitor 141 and the second capacitor 142 also become the $V_{ref}$. At this time, electric charge corresponding to the $V_{ref}$ is accumulated in the first terminal of the first capacitor 141.

Further, the potential (also called $V_{123}$) of the signal input to the latch circuit 123 at this time is the $V_{ref}$. This is the operation performed in the first period 251. Actually, the $V_{123}$ is the value obtained by subtracting the offset potential of the comparator 103 from the $V_{ref}$. Therefore, even in the case where the offset potential of the comparator 103 changes over time, the input/output signals of the comparator 103 can be corrected by the provision of the third switching element 113. In the description of Embodiment 2, it is assumed that the $V_{123}$ becomes the $V_{ref}$ for convenience.

Next, in the second period 252, the first switching element 111 is on and the fourth switching element 114 is off. The second switching element 112 and the third switching element 113 remain off.

At this time, the charge/discharge circuit 101 releases the electric charge in accordance with the amount of the first current generated by the photoelectric conversion circuit 100. At this time, the $V_{106}$ decreases to $V_x$. The $V_x$ is a given value that is higher than the $V_{ss}$ and lower than $V_{max}$ at which the electric charge is accumulated as much as possible in the charge/discharge circuit 101.

Moreover, the $V_{123}$ is $V_{dd}$ because the $V_{106}$ is lower than the $V_{ref}$ and the output signal of the comparator 103 has the $V_{dd}$. This is the operation performed in the second period 252.

Next, in the third period 253, the first switching element 111 is off and the second switching element 112 is on. The third switching element 113 and the fourth switching element 114 remain off.

Here, since the second current flows from the second terminal to the first terminal in the current circuit 102, the electric charge is accumulated for every constant amount in the charge/discharge circuit 101 in accordance with the second current. The $V_{106}$ increases to become the $V_{ref}$ at the time $t_1$ and then become the $V_{max}$. The length of time for which the $V_{106}$ increases from the $V_x$ to the $V_{ref}$ (also called a discharge time) differs depending on the amount of electric charge accumulated in the charge/discharge circuit 101. The amount of electric charge accumulated in the charge/discharge circuit 101 differs depending on the electrical capacitance of the charge/discharge circuit 101 or the amount of the first current generated by the photoelectric conversion circuit 100.

In the counter circuit 124, at the time when the second switching element 112 is turned on, the edge of the clock signal starts to be counted (also called counted-up). The time at this point is expressed as $t_0$. After that, when the potential of the $V_{106}$ increases to become the $V_{ref}$ at the time $t_1$, the potential of the output signal of the comparator 103 becomes $V_{ss}$. When the signal with the $V_{ss}$ is input to the latch circuit 123, the signal with the potential based on a first count value 800 from the time $t_0$ to the time $t_1$ is held in the latch circuit 123 and a digital signal is generated by the interface circuit 126 in accordance with the value held. This is the operation performed in the third period 253.

The amount of the second current ($i_0$) of the current circuit 102 in the third period 253 is preferably set as $i_0$=($t_0$×the amount of the first current corresponding to one count value)/ (0.5 cycle of time of the clock signal in the clock signal generating circuit 125). Accordingly, the comparison between the potentials in the comparator 103 can be performed more accurately.

Next, the case where the $I_L$ is larger than the $I_{ref}$ is described.

As FIG. 12 indicates, since the operation in the first period 251 is the same as that in the case where the $I_L$ is smaller than the $I_{ref}$, the description in that case is referred to.

Next, in the second period 252, the first switching element 111 is on and the fourth switching element 114 is off. The second switching element 112 remains off. Moreover, the third switching element 113 remains off in a certain period in the second period 252.

At this time, the electric charge is accumulated in the charge/discharge circuit 101 in accordance with the amount of the first current generated by the photoelectric conversion circuit 100. When the $V_{106}$ decreases to $V_z$, the third switching element 113 is turned on. Note that the $V_z$ is a given value that is higher than $V_{ss}$ and lower than $V_{max}$ at which the electric charge is accumulated as much as possible in the charge/discharge circuit 101; for example, the value can be set by the comparison circuit illustrated in FIG. 5.

Moreover, when the third switching element 113 is turned on, the capacitive coupling occurs, so that the $V_{106}$ increases from the $V_z$ to $V_w$. At this time, when the first capacitor 141 has an electrical capacitance of $C_1$ and the second capacitor has an electrical capacitance of $C_2$, $V_w$=$C_1V_z/(C_1+C_2)$. That is, the $V_w$ is a given value that is set by setting the electrical capacitance of the first capacitor 141 and the second capacitor 142.

Moreover, the $V_{106}$ decrease again from the $V_w$ to $V_y$. The $V_y$ is a given value that is higher than the $V_{ss}$ and lower than the $V_{max}$.

Moreover, the $V_{123}$ is $V_{dd}$ because the $V_{106}$ is lower than the $V_{ref}$ and the output signal of the comparator 103 has the $V_{dd}$. This is the operation performed in the second period 252.

Next, in the third period 253, the first switching element 111 is off and the second switching element 112 is on. Further, the third switching element 113 remains on and the fourth switching element 114 remains off.

Here, since the second current flows from the second terminal to the first terminal in the current circuit 102, the charge is accumulated for every constant amount in the charge/discharge circuit 101 in accordance with the second current. The $V_{106}$ increases to become the $V_{ref}$ at the time $t_2$ and then become the $V_{max}$. The length of time for which the $V_{106}$ increases from the $V_y$ to the $V_{ref}$ (also called a discharge time) differs depending on the amount of the electric charge accumulated in advance in the charge/discharge circuit 101. The amount of the electric charge accumulated in the charge/discharge circuit 101 differs depending on the electrical capacitance of the charge/discharge circuit 101 or the amount of the first current generated by the photoelectric conversion circuit 100.

In the counter circuit 124, at the time when the second switching element 112 is turned on, the edge of the clock signal is counted up. The time at this point is $t_0$. After that, when the potential of the $V_{106}$ increases to become the $V_{ref}$ at the time $t_2$, the potential of the output signal of the comparator 103 becomes the $V_{ss}$. When the signal with the $V_{ss}$ is input to the latch circuit 123, the signal with the potential based on a second count value 801 from the time $t_0$ to the time $t_2$ is held in the latch circuit 123 and a digital signal is generated by the interface circuit 126 in accordance with the value held. This is the operation performed in the third period 253.

As thus described, even in the case where the amplifier circuit 601 includes the n-channel transistor, the electric charge accumulated in advance in the charge/discharge circuit 101 can be discharged in accordance with the amount of the first current in such a manner that the amount of the electric charge which corresponds to the amount of the first current does not exceed the upper limit of accumulation of the charge/discharge circuit 101, by changing the electrical capacitance of the charge/discharge circuit 101 in accordance with the amount of the first current generated in the photoelectric conversion circuit 100, that is, in accordance with the illuminance of the incident light. Therefore, the resolution to the illuminance of the light in the photoelectric conversion can be improved.

Note that Embodiment 2 can be combined with any of the other embodiments as appropriate.

Embodiment 3

Embodiment 3 describes a method for manufacturing a photoelectric conversion device according to an embodiment of the present invention. Here, a method for manufacturing the photoelectric conversion device of Embodiment 1 including a thin film transistor is described as an example.

The method for manufacturing the photoelectric conversion device according to Embodiment 3 is described with reference to FIGS. 13A to 13D and FIGS. 14A to 14C. FIGS. 13A to 13D and FIGS. 14A to 14C are cross-sectional schematic views which illustrate an example of the method for manufacturing the photoelectric conversion device according to Embodiment 3. Note that FIGS. 13A to 13D and FIGS. 14A to 14C illustrate cross sections of the photoelectric conversion device schematically for convenience with sizes which are partly or entirely different from actual sizes.

With reference to FIGS. 13A to 13D and FIGS. 14A to 14C, an example of forming a photoelectric conversion element, a transistor, and a capacitor over a substrate is described. When the transistor formed over the substrate is a thin film transistor, the photoelectric conversion element and the transistor can be formed over the substrate through the same process. Thus, there is an advantage that mass production of the photoelectric conversion device including the photoelectric conversion circuit is easy. Further, by electrically connecting a gate electrode and a drain electrode of the transistor to each other, the transistor can also be used as a diode.

Figure 13A:
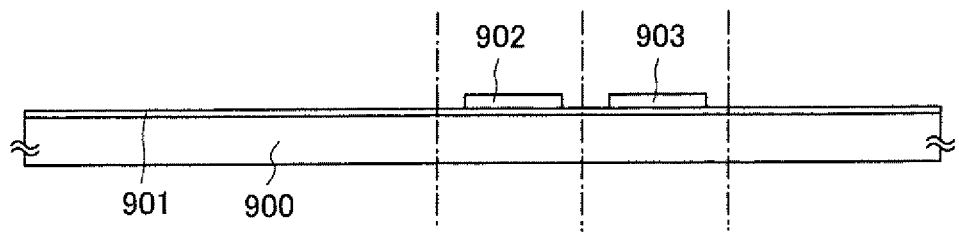
FIGS. 13A to 13D are cross-sectional schematic views which illustrate an example of a method for manufacturing the photoelectric conversion device in Embodiment 3.

First, as illustrated in FIG. 13A, a base insulating film 901 is formed over a substrate (a first substrate 900), and an island-shaped first semiconductor layer 902 and an island-shaped second semiconductor layer 903 are formed over part of the base insulating film 901.

A glass substrate or the like can be used as the substrate 900, for example. The base insulating film 901 can be formed using, for example, a silicon oxide film, a silicon nitride film, or a silicon oxide film including nitrogen. Alternatively, the base insulating film 901 can be formed using a single-layer structure or a stacked structure including any of a silicon oxide film, a silicon nitride film, or a silicon oxide film including nitrogen. Further, the above described film can be formed by a plasma CVD method or the like, for example. Note that a silicon oxide film including nitrogen or a silicon nitride film functions as a blocking layer which prevents diffusion of impurities such as alkali metal and the like from a glass substrate. Here, for example, a 100-nm-thick silicon oxide film including nitrogen is formed as the base insulating film 901. As the first semiconductor layer 902 and the second semiconductor layer 903, a film of a non-single-crystal semiconductor typified by amorphous silicon, polycrystalline silicon, microcrystalline (also referred to as microcrystal or nanocrystal) silicon, or the like can be used.

Alternatively, for example, a semiconductor film having a crystalline structure (a crystalline semiconductor film), which is formed by crystallizing an amorphous semiconductor film by a known technique (e.g., a solid-phase growth method, a laser crystallization method, or a crystallization method using catalytic metal), such as a polycrystalline silicon film, can be used for the first semiconductor layer 902 and the second semiconductor layer 903. Here, a polycrystalline silicon film obtained by a crystallization method in which a catalytic element is used is employed. A nickel acetate solution including 10 ppm of nickel by weight is added with a spinner. Note that a nickel element may be dispersed over the entire surface by a sputtering method instead of adding the solution. Next, the semiconductor film is crystallized by heat treatment to form a semiconductor film having a crystalline structure (here, a polycrystalline silicon film). An example of forming the first semiconductor layer 902 and the second semiconductor layer 903 is described below.

Here, for example, a 54-nm-thick amorphous silicon film including hydrogen is formed without being exposed to the atmospheric air. Then, heat treatment (at 500° C. for one hour) is performed and after that, another heat treatment for crystallization (at 550° C. for four hours) is performed, so that a polycrystalline silicon film is formed.

Next, an oxide film on a surface of the polycrystalline silicon film is removed with dilute hydrofluoric acid or the like. After that, irradiation with laser light (XeCl: wavelength of 308 nm) is performed in the atmospheric air or in an oxygen atmosphere in order to raise a degree of crystallization and repair a defect left in a crystal grain.

Excimer laser light with a wavelength of 400 nm or less, or the second harmonic or the third harmonic of a YAG laser is used as the laser light. Here, pulsed laser light having a repetition rate of approximately 10 Hz to 1000 Hz is used. The laser light is condensed through an optical system to have 100 mJ/cm$^2$ to 500 mJ/cm$^2$, and the irradiation is performed with an overlap ratio of 90% to 95%, thereby scanning the silicon film surface. In Embodiment 3, the irradiation with the laser light is performed in the atmospheric air with a repetition rate of 30 Hz and an energy density of 470 mJ/cm$^2$.

Note that an oxide film is formed on the surface by the laser light irradiation since the irradiation is performed in the atmospheric air or in the oxygen atmosphere. Although the pulsed laser light is used here, continuous wave laser light may be used alternatively. In order to form a crystal with a large grain size through the crystallization of a semiconductor film, any of the second to fourth harmonics of the fundamental wave of a solid-state laser capable of continuous wave oscillation is preferably used. As a typical example, the second harmonic (532 nm) or the third harmonic (355 nm) of an Nd:YVO$_4$ laser (fundamental wave of 1064 nm) is given.

In the case of using a continuous wave laser, laser light emitted from a continuous wave YVO$_4$ laser of 10 W output is converted into a harmonic by using a non-linear optical element The harmonic can alternatively be obtained by putting a YVO$_4$ crystal and a non-linear optical element in the resonator. Then, the laser light is preferably shaped through an optical system to be rectangular or elliptical on an irradiated plane, and an object to be processed is irradiated with this laser light. The energy density here is required to be in the range of approximately 0.01 MW/cm$^2$ to 100 MW/cm$^2$ (preferably 0.1 MW/cm$^2$ to 10 MW/cm$^2$). Then, the laser light is delivered while the semiconductor film is moved relative to the laser light at a rate of about 10 cm/s to 2000 cm/s.

Next, the surface is processed with ozone water for 120 seconds, so that an oxide film is formed. The oxide film formed by the above laser light irradiation and the oxide film formed by the ozone water, which have a thickness of 1 to 5 nm in total, serve as a barrier layer. This barrier layer is formed for the purpose of removing the catalytic element added for the crystallization, for example nickel (Ni), from the film. Although the barrier layer is formed by using ozone water here, the barrier layer may alternatively be formed by any of the following methods: a method by which a surface of the semiconductor film with a crystalline structure is oxidized by irradiation with UV ray in an oxygen atmosphere, a method by which a surface of the semiconductor film with a crystalline structure is oxidized by an oxygen plasma process, or a plasma CVD method, a sputtering method, an evaporation method, or the like by which an oxide film with a thickness of about 1 nm to 10 nm is deposited. In addition, before forming the barrier layer, the oxide film formed by the laser light irradiation may be removed.

Next, an amorphous silicon film including argon, which serves as a gettering site, is formed to a thickness of 10 nm to 400 nm, here a thickness of 100 nm, over the barrier layer by a sputtering method. Here, the amorphous silicon film including argon is formed in an atmosphere including argon using a silicon target. In the case of using a plasma CVD method, the amorphous silicon film including argon is formed under the condition where the flow rate between monosilane and argon (SiH$_4$:Ar) is 1:99, the film-forming pressure is 6.665 Pa, RF power density is 0.087 W/cm$^2$, and the film-forming temperature is 350° C.

After that, the removal (gettering) of the catalytic element is performed by heat treatment for three minutes in a furnace heated at 650° C. By this treatment, the concentration of the catalytic element in the semiconductor film having a crystalline structure is reduced. A lamp annealing apparatus may be used instead of the furnace.

Next, after the amorphous silicon film including argon, which is a gettering site, is removed as selected using the barrier layer as an etching stopper, the barrier layer is removed as selected with dilute hydrofluoric acid. Since nickel tends to move to a region with a high concentration of oxygen in the gettering, the barrier layer including the oxide film is desirably removed after the gettering.

In the case where the semiconductor film is crystallized without a catalytic element, the above-described steps such as the formation of the barrier layer, the formation of the gettering site, the heat treatment for the gettering, the removal of the gettering site, and the removal of the barrier layer are not necessary.

The method for forming the first semiconductor layer 902 and the second semiconductor layer 903 is not limited to the above-described method, and a different manufacturing method may be employed in manufacturing the photoelectric conversion device according to Embodiment 3. For example, the first semiconductor layer 902 and the second semiconductor layer 903 may be formed using an SOI (silicon on insulator) substrate. The SOI substrate may be a known SOI substrate, and there is no particular limitation on a manufacturing method and a structure thereof. As the SOI substrate, a SIMOX substrate and a bonded substrate are typically given. In addition, examples of the bonded substrate are ELTRAN®, UNIBOND®, Smart Cut®, and the like.

In the case of the SIMOX substrate, an oxygen ion is implanted into a single crystal silicon substrate and heat treatment at 1300° C. or more is performed to form a buried oxide (BOX) film layer; thus, a thin-film silicon layer is formed on the surface of the single crystal silicon substrate, and an SOI structure can be obtained. The thin-film silicon layer is insulated from the single crystal silicon substrate by the buried oxide film layer. Further, a technique called internal thermal oxidation SIMOX (ITOX) in which thermal oxidation is further performed after the buried oxide film layer is formed can be used.

A bonded substrate is an SOI substrate which is obtained in such a manner that two single crystal silicon substrates (a first single crystal silicon substrate and a second single crystal silicon substrate) are bonded with an oxide film layer interposed therebetween and one of the single crystal silicon substrates is sliced from a surface on the side which is opposite to the bonded side, so that a thin film silicon layer is formed on the surface. The oxide film layer can be formed by thermal oxidation of one of the substrates (here the first single crystal silicon substrate). Further, the two single crystal silicon substrates can be bonded to each other directly without using an adhesive.

Note that the bonded substrate may be formed in such a manner that a substrate having an insulating surface such as a glass substrate and a single crystal substrate are bonded to each other, instead of bonding two single crystal substrates to each other.

Furthermore, here, after a thin oxide film is formed by using ozone water over the surface of the semiconductor film having a crystalline structure (e.g., a crystalline silicon film), a resist mask is formed using a first photomask, with which the semiconductor film is etched to have a desired shape, whereby the first semiconductor layer 902 and the second semiconductor layer 903 which are separated from each other in island shapes are formed. After the first semiconductor layer 902 and the second semiconductor layer 903 are formed, the resist mask is removed.

In the method for manufacturing the photoelectric conversion device according to Embodiment 3, an impurity element (boron or phosphorus) can be added to the first semiconductor layer 902 and the second semiconductor layer 903 if necessary. In the case of adding the impurity element, for example, diborane (B$_2$H$_6$) may be added by an ion doping method in which plasma excitation is performed without mass separation.

Moreover, in the method for manufacturing the photoelectric conversion device according to Embodiment 3, the oxide film is removed with an etchant including hydrofluoric acid, and at the same time, surfaces of the first semiconductor layer 902 and the second semiconductor layer 903 are cleaned. After that an insulating film including silicon as its main component, which serves as a gate insulating film 904, is formed. Here, a silicon oxide film including nitrogen (composition ratio Si=32%, O=59%, N=7%, H=2%) is formed to a thickness of 115 nm by a plasma CVD method.

Figure 13B:
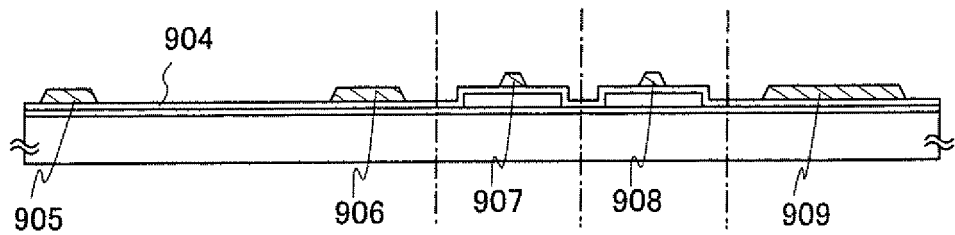

Next, as illustrated in FIG. 13B, the gate insulating film 904 is formed over the base insulating film 901 with the first semiconductor layer 902 and the second semiconductor layer 903 interposed therebetween; electrodes 905, 906, 908, and 909 are formed over the gate insulating film 904; and a gate electrode 907 is formed over part of the first semiconductor layer 902 with the gate insulating film 904 interposed therebetween. As the gate insulating film 904, an insulating nitride film, an insulating oxide film, an insulating oxide film including nitrogen, or the like can be used, for example. In addition, for the electrodes 905 and 906, the gate electrode 907, and the electrodes 908 and 909, a single-layer film formed using an element selected from titanium, tungsten, tantalum, molybdenum, neodymium, cobalt, zirconium, zinc, ruthenium, rhodium, palladium, osmium, iridium, platinum, aluminum, gold, silver, or copper, or an alloy material or a compound material containing the above element as its main component; or a single-layer film formed using nitride of the above element, e.g., titanium nitride, tungsten nitride, tantalum nitride, or molybdenum nitride can be used, for example.

Figure 13C:
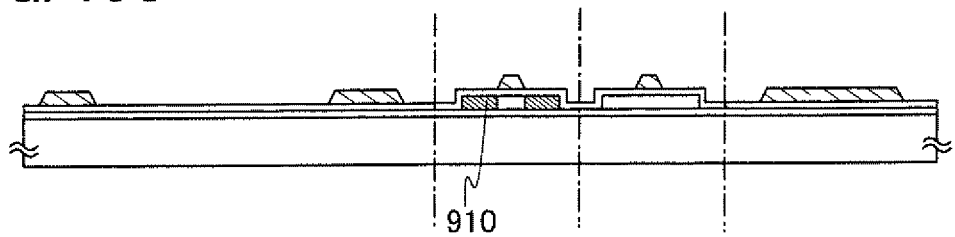

Next, as illustrated in FIG. 13C, an impurity imparting one conductivity type is introduced into the first semiconductor layer 902 to form impurity regions 910 which serve as a source region and a drain region in the first semiconductor layer 902. Here, for example, an impurity imparting n-type conductivity such as phosphorus or arsenic is introduced; however, a different impurity may be used. In the method for manufacturing the photoelectric conversion device according to Embodiment 3, an impurity imparting p-type conductivity can be introduced to the first semiconductor layer 902.

Figure 13D:
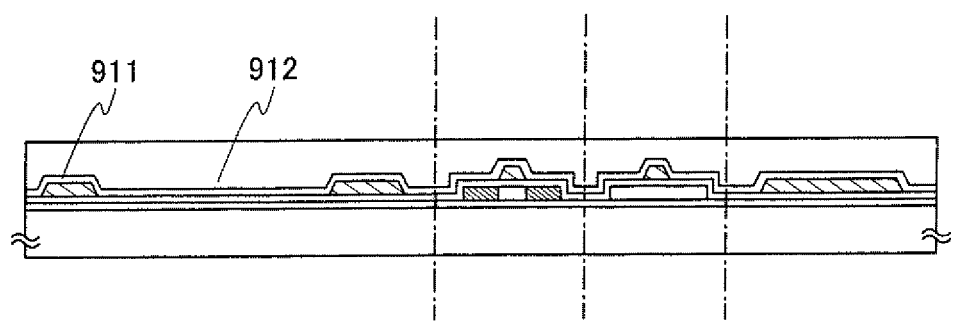

Next, as illustrated in FIG. 13D, a first interlayer insulating film 911 is formed. The first interlayer insulating film 911 can be formed using a single-layer structure or a stacked structure of any of an insulating oxide film, an insulating nitride film, an insulating nitride film including oxygen, an insulating nitride film including hydrogen and oxygen, or the like by a CVD method or the like, for example. Then, for example, after a first interlayer insulating film including a silicon oxide film (not shown) is formed to have a thickness of 50 nm by a CVD method, a step of an activating the impurity element added to each island-shaped semiconductor region is carried out. The activation step is conducted by a rapid thermal annealing method (an RTA method) in which a lamp light source is used, a method in which irradiation with a YAG laser or an excimer laser is performed from the back side, heat treatment in a furnace, or a method which is a combination of any of the foregoing methods.

In addition, a second interlayer insulating film 912 is formed over the first interlayer insulating film 911. An insulating material can be used for the second interlayer insulating film 912, for example. Alternatively, an insulating film formed by a CVD method can be used as the second interlayer insulating film 912. In Embodiment 3, in order to improve adhesion, a silicon oxide film including nitrogen is formed to a thickness of 900 nm as the second interlayer insulating film 912.

Further, in Embodiment 3, heat treatment (heat treatment at 300° C. to 550° C. for 1 to 12 hours, e.g., at 410° C. for one hour in a nitrogen atmosphere) is performed to hydrogenate the first semiconductor layer 902 and the second semiconductor layer 903. This step is performed in order to terminate dangling bonds of the semiconductor layers with use of hydrogen contained in the first interlayer insulating film 911. The semiconductor layers can be hydrogenated regardless of whether the gate insulating film 904 exists or not.

Alternatively, as the second interlayer insulating film 912, an insulating film including siloxane or a stacked structure thereof can be used. A skeletal structure of siloxane includes a bond of silicon (Si) and oxygen (O). As a substituent, a compound containing at least hydrogen (such as an alkyl group or an aromatic hydrocarbon) is used. Fluorine may also be used as a substituent. Alternatively, fluorine and a compound including at least hydrogen may be used as substituents. In the case where an insulating film including siloxane or a stacked structure including the insulating film is used as the second interlayer insulating film 912, the steps can be as follows: the first interlayer insulating film 911 is formed; heat treatment for hydrogenating the island-shaped semiconductor films is performed; then, the second interlayer insulating film 912 is formed.

Next, a resist mask is formed using a third photomask, with which the first interlayer insulating film 911, the second interlayer insulating film 912, and the gate insulating film 904 are etched as selected; thus, contact holes are formed. Then, the resist mask is removed.

Note that the second interlayer insulating film 912 may be formed as necessary. When the second interlayer insulating film 912 is not formed, contact holes are formed by etching as selected the first interlayer insulating film 911 and the gate insulating film 904 after forming the first interlayer insulating film 911.

Figure 14A:
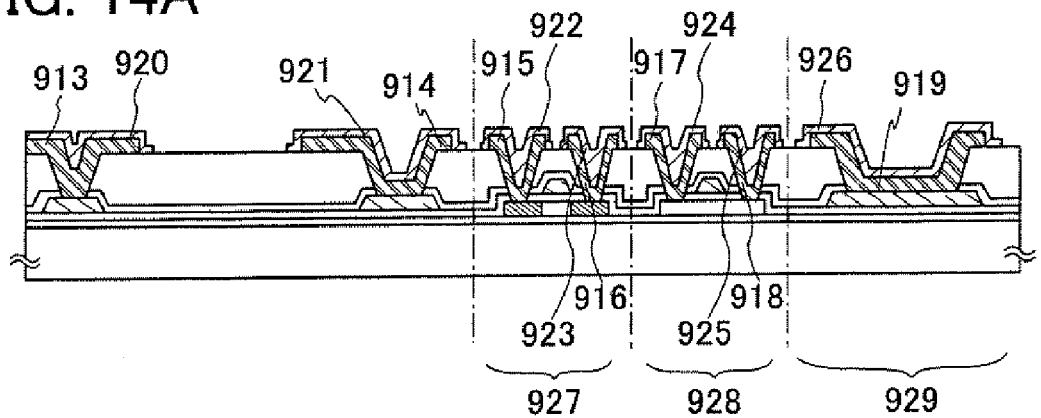
FIGS. 14A to 14C are cross-sectional schematic views which illustrate an example of a method for manufacturing the photoelectric conversion device in Embodiment 3.

Next, as illustrated in FIG. 14A, after a metal stacked-layer film is formed by a sputtering method, a resist mask is formed using a fourth photomask, with which the metal film is etched as selected to form electrodes 913 to 919. Then, the resist mask is removed. Note that in Embodiment 3, for example, the electrodes 913 to 919 are formed by stacking three layers: a 100-nm-thick Ti film, a 350-nm-thick Al film including Si, and a 100-nm-thick Ti film.

In addition, for the electrodes 913 to 919, titanium is preferably used in terms of heat resistance, electrical conductivity, and the like. Alternatively, instead of titanium, a single-layer film including an element selected from tungsten, tantalum, molybdenum, neodymium, cobalt zirconium, zinc, ruthenium, rhodium, palladium, osmium, iridium, or platinum, or an alloy material or a compound material containing the above element as its main component; or a single-layer film including nitride of the above element, e.g., titanium nitride, tungsten nitride, tantalum nitride, or molybdenum nitride can be used. By forming the electrodes 913 to 919 as a single-layer film, the number of times of depositions can be reduced in the manufacturing process.

In this manner, a transistor 927, a capacitor 928, and a terminal portion 929 each including the polycrystalline silicon film can be completed.

Next, a conductive metal film (e.g., titanium or molybdenum) which does not easily react with a photoelectric conversion element to be formed later and an alloy is not easily formed is formed. Then, a resist mask is formed using a fifth photomask, with which the conductive metal film is etched as selected to form protective electrodes 920 to 926. In Embodiment 3, a Ti film with a thickness of 200 nm formed by a sputtering method is used for the protective electrodes 920 to 926. Therefore, the conductive metal film also covers a side face where the Al film as the second layer is exposed in these electrodes, so that the conductive metal film can also prevent diffusion of an aluminum atom to the photoelectric conversion element.

However, in the case of forming the electrodes 913 to 919 with use of a single-layer conductive film, the protective electrodes 920 to 926 are not necessarily formed.

Figure 14B:
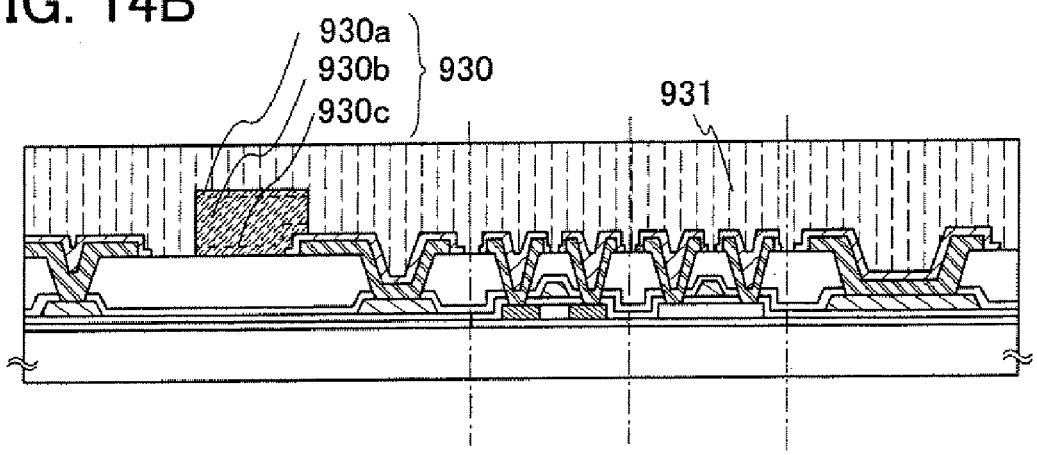
Figure 14C:
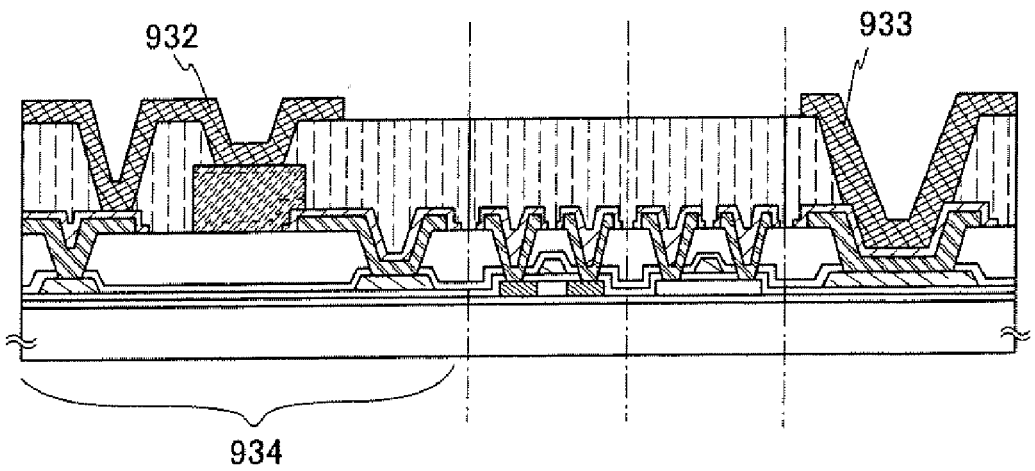

Next, as illustrated in FIG. 14B, a photoelectric conversion element 930 including a p-type semiconductor layer 930a, an i-type semiconductor layer 930b, and an n-type semiconductor layer 930c is formed over the second interlayer insulating film 912.

The p-type semiconductor layer 930a may be formed using a semi-amorphous silicon film including a Group 13 element in the periodic table, e.g., boron (B) by a plasma CVD method.

Further, the protective electrode 921 is in contact with the bottom layer of the photoelectric conversion element 930, i.e., the p-type semiconductor layer 930a in Embodiment 3.

After the p-type semiconductor layer 930a is formed, the i-type semiconductor layer 930b and the n-type semiconductor layer 930c are formed in that order. Thus, the photoelectric conversion element 930 including the p-type semiconductor layer 930a, the i-type semiconductor layer 930b, and the n-type semiconductor layer 930c is formed.

As the i-type semiconductor layer 930b, for example, a microcrystalline silicon film formed by a plasma CVD method may be used. As the n-type semiconductor layer 930c, for example, a microcrystalline silicon film including a Group 15 element in the periodic table, such as phosphorus (P), may be formed; alternatively, after forming a microcrystalline silicon film, a Group 15 element in the periodic table may be introduced to the microcrystalline silicon film.

For each of the p-type semiconductor layer 930a, the i-type semiconductor layer 930b, and the n-type semiconductor layer 930c, an amorphous semiconductor film may be used as well as the semi-amorphous semiconductor film.

Next, a sealing layer 931 formed from an insulating material (e.g., an inorganic insulating film including silicon) is deposited to a thickness of 1 μm to 30 μm over the entire surface. Here, as an insulating material film, a silicon oxide film including nitrogen is formed to a thickness of 1 μm by a CVD method. The adhesion is improved by using the insulating film formed by a CVD method.

Next, after the sealing layer 931 is etched to provide openings, an electrode 932 and an electrode 933 are formed by a sputtering method. For the electrodes 932 and 933, a single-layer film including an element selected from titanium, tungsten, tantalum, molybdenum, neodymium, cobalt, zirconium, zinc, ruthenium, rhodium, palladium, osmium, iridium, platinum, or gold, or an alloy material or a compound material including the above element as its main component; or a single-layer film including nitride of the above element, e.g., titanium nitride, tungsten nitride, tantalum nitride, or molybdenum nitride can be used. The electrodes 932 and 933 thus obtained have a fixing strength higher than 5 N, which is sufficient for electrodes.

Thus, a photoelectric conversion portion 934 is formed.

In this manner, the photoelectric conversion device according to an embodiment of the present invention is completed. By the method for manufacturing the photoelectric conversion device according to Embodiment 3, a diode, a resistor, a transistor, and a photoelectric conversion portion can be formed over one substrate; therefore, mass production is easy.

By the method for manufacturing the photoelectric conversion device according to Embodiment 3, mass production can be achieved in such a manner that a plurality of photoelectric conversion devices is manufactured over one substrate and the substrate is cut into individual photoelectric conversion devices. A large number of photoelectric conversion devices (e.g., 2 mm×1.5 mm) can be manufactured from one large substrate (e.g., 600 cm×720 cm).

Note that Embodiment 3 can be combined with any of other embodiments as appropriate.

Embodiment 4

Embodiment 4 describes a variety of electronic appliances on each of which a photoelectric conversion device according to an embodiment of the present invention is mounted.

As examples of electronic appliances on which the photoelectric conversion device which is an embodiment of the present invention can be mounted, there are computers, displays, cellular phones, television receivers, and the like. Specific examples of those electronic appliances are described with reference to FIG. 15, FIGS. 16A and 16B, FIGS. 17A and 17B, FIG. 18, and FIGS. 19A and 19B. FIG. 15, FIGS. 16A and 16B, FIGS. 17A and 17B, FIG. 18, and FIGS. 19A and 19B illustrate structure examples of electronic appliances of Embodiment 4.

Figure 15:
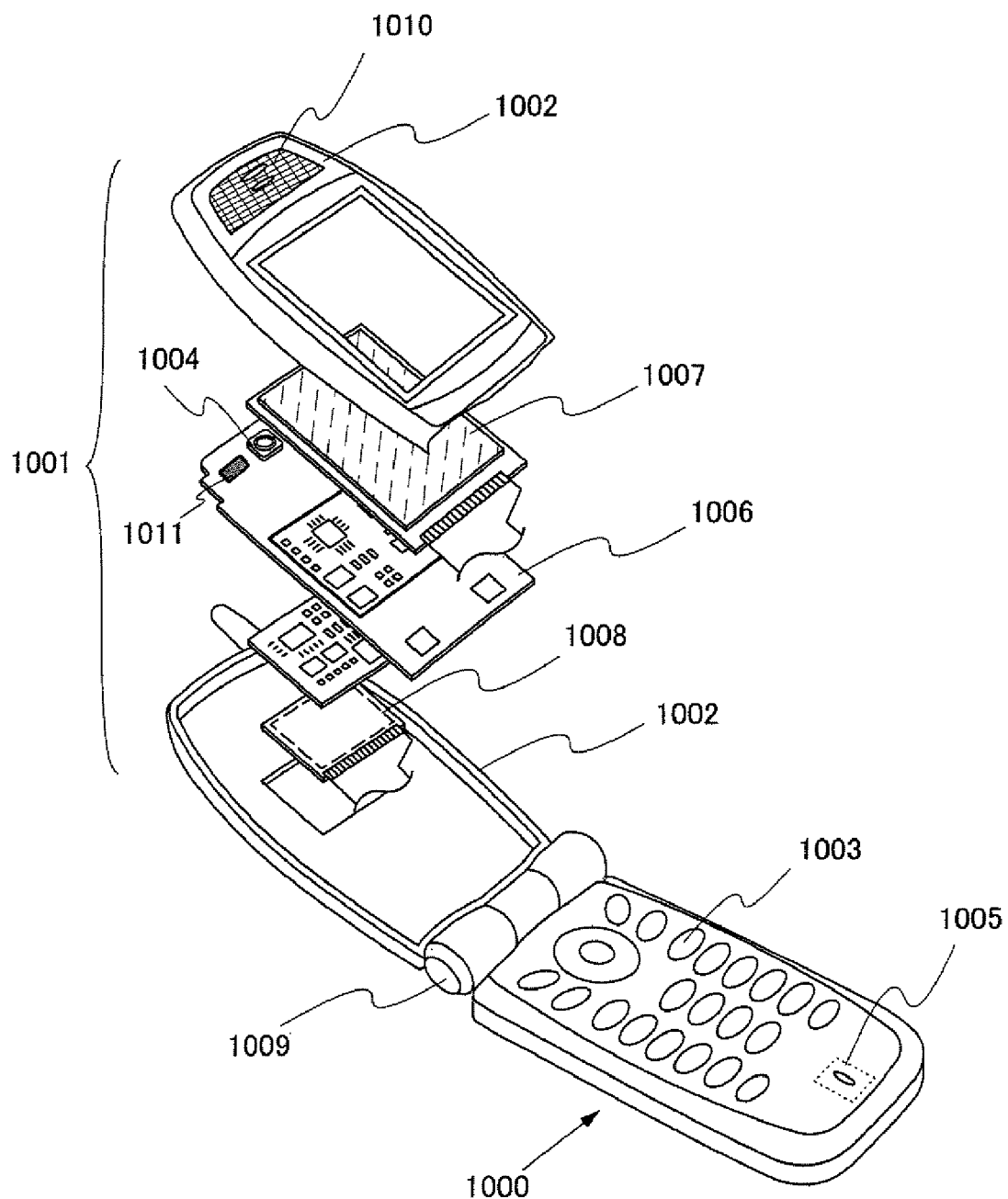
FIG. 15 is a schematic view which illustrates an example of a structure of an electronic appliance in Embodiment 4.

FIG. 15 illustrates a cellular phone including a main body (A)1000, a main body (B)1001, a housing 1002, operation keys 1003, an audio output portion 1004, an audio input portion 1005, a circuit board 1006, a display panel (A)1007, a display panel (B)1008, a hinge 1009, a light-transmitting material portion 1010, and a photoelectric conversion device 1011. A photoelectric conversion device according to an embodiment of the present invention can be used as the photoelectric conversion device 1011.

The photoelectric conversion device 1011 detects light which transmits through the light-transmitting material portion 1010. The luminance of the display panel (A)1007 and the display panel (B)1008 is controlled in accordance with the illuminance of detected external light, and the illumination of the operation keys 1003 is controlled in accordance with illuminance obtained by the photoelectric conversion device 1011. Accordingly, current consumption of the cellular phone can be suppressed.

Figure 16A:
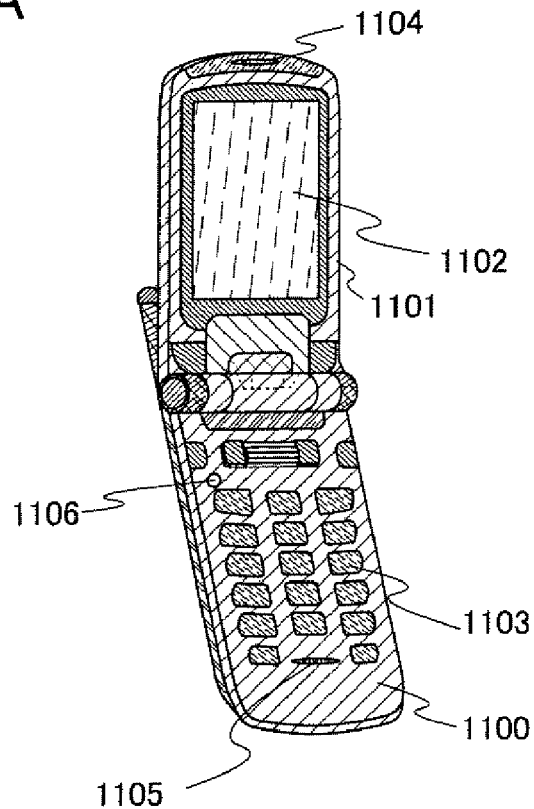
FIGS. 16A and 16B are schematic views each of which illustrates an example of a structure of an electronic appliance in Embodiment 4.
Figure 16B:
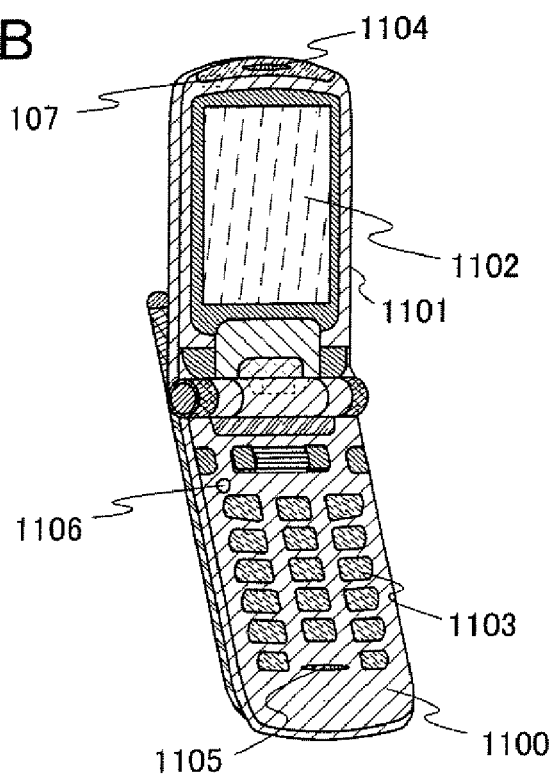

FIGS. 16A and 16B illustrate other examples of cellular phones. In FIGS. 16A and 16B, a main body 1100, a housing 1101, a display panel 1102, operation keys 1103, an audio output portion 1104, an audio input portion 1105, a photoelectric conversion device 1106, and a photoelectric conversion device 1107 are illustrated.

In the cellular phone illustrated in FIG. 16A, external light is detected by the photoelectric conversion device 1106 provided in the main body 1100, whereby the luminance of the display panel 1102 and the operation keys 1103 can be controlled.

In the cellular phone illustrated in FIG. 16B, the photoelectric conversion device 1107 is provided inside the main body 1100 in addition to the structure of FIG. 16A. With the photoelectric conversion device 1107, the luminance of a backlight provided in the display panel 1102 can be detected.

Figure 17A:
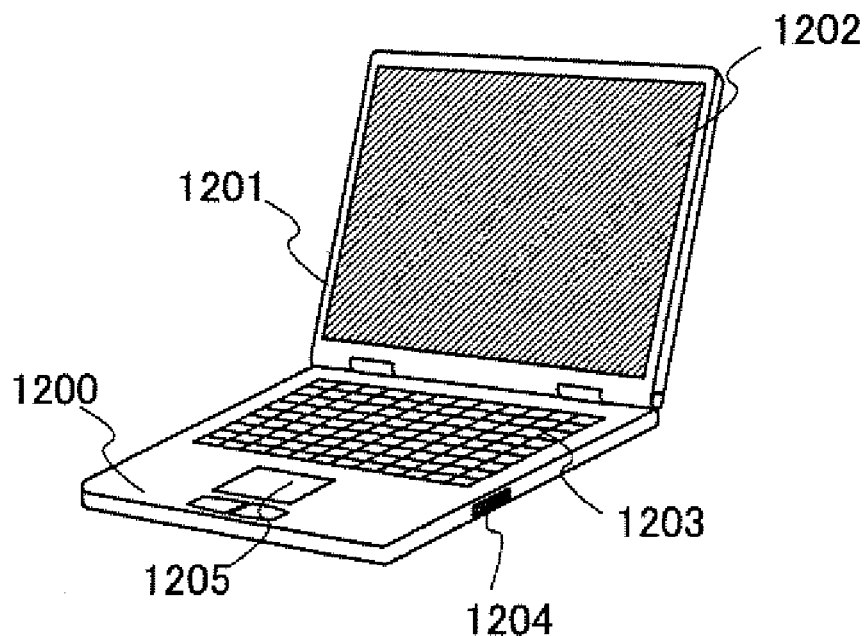
FIGS. 17A and 17B are schematic views each of which illustrates an example of a structure of an electronic appliance in Embodiment 4.

FIG. 17A illustrates a computer which includes a main body 1200, a housing 1201, a display portion 1202, a keyboard 1203, an external connection port 1204, a pointing device 1205, and the like.

Figure 17B:
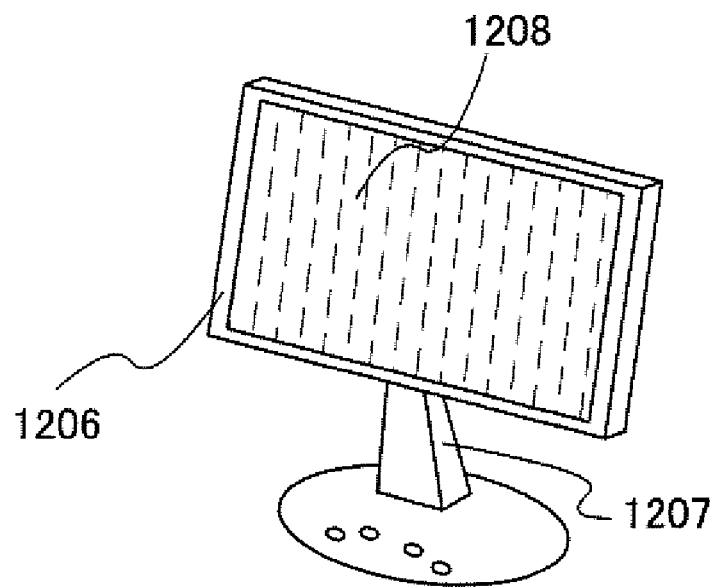

FIG. 17B illustrates a display device, and a television receiver corresponds to the display device. The display device in FIG. 17B includes a housing 1206, a support base 1207, a display portion 1208, and the like.

Figure 18:
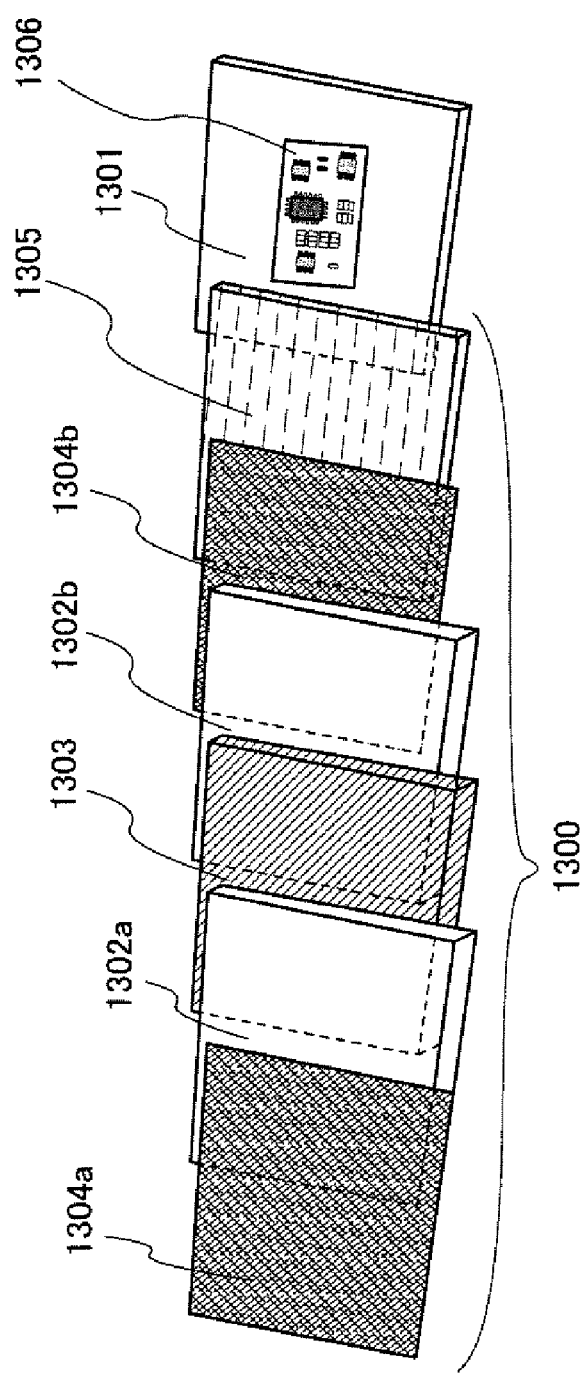
FIG. 18 is a schematic view which illustrates an example of a structure of an electronic appliance in Embodiment 4.

FIG. 18 illustrates a detailed structure of a liquid crystal panel which can be used for the display portion 1202 of the computer of FIG. 17A and for the display portion 1208 of the display device of FIG. 17B.

A liquid crystal panel 1300 illustrated in FIG. 18 is incorporated in a base 1301 and includes a substrate 1302a and a substrate 1302b, a liquid crystal layer 1303 interposed between the substrate 1302a and 1302b, a polarization filter 1304a and a polarization filter 1304b, a backlight 1305, and the like. The base 1301 is provided with a photoelectric conversion device 1306.

As the photoelectric conversion device 1306, a photoelectric conversion device according to an embodiment of the present invention can be used. The photoelectric conversion device 1306 can sense the amount of light from the backlight 1305, and the information on the amount of light is fed back, so that the luminance of the liquid crystal panel 1300 is adjusted.

Figure 19A:
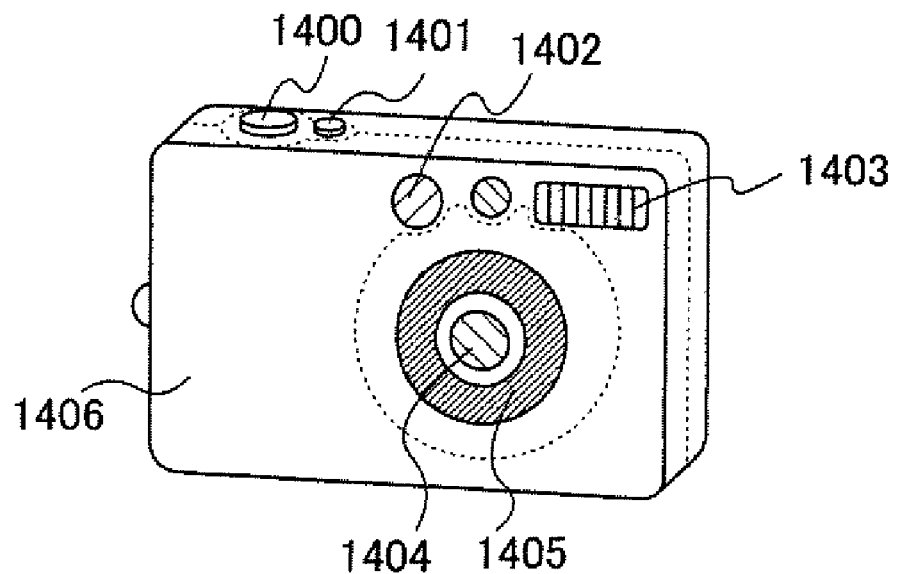
FIGS. 19A and 19B are schematic views which illustrate an example of a structure of an electronic appliance in Embodiment 4.
Figure 19B:
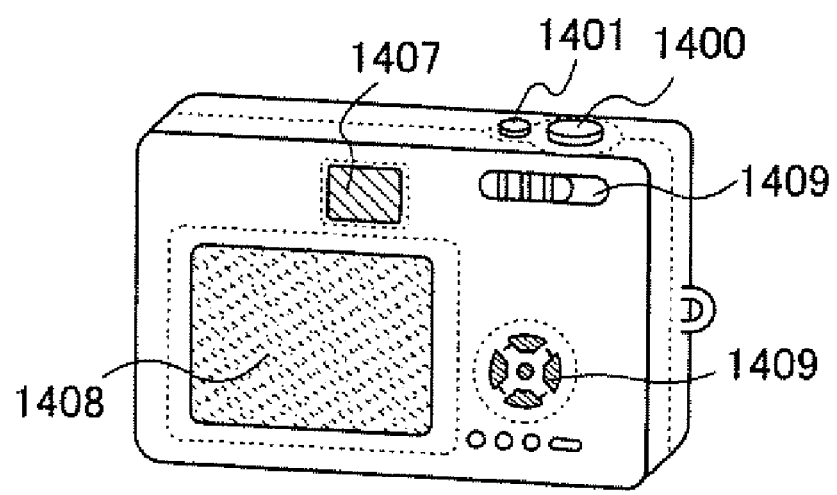

FIGS. 19A and 19B illustrate an example in which a photoelectric conversion device according to an embodiment of the present invention is incorporated into a camera, for example into a digital camera. FIG. 19A is a perspective view from the front side of the digital camera, and FIG. 19B is a perspective view from the back side thereof. In FIG. 19A, the digital camera includes a release button 1400, a main switch 1401, a viewfinder 1402, a flash portion 1403, a lens 1404, a lens barrel 1405, and a housing 1406.

In addition, in FIG. 19B, the digital camera is provided with an eyepiece finder 1407, a monitor 1408, and an operation button 1409.

When the release button 1400 is pushed down to the half point, a focus adjustment mechanism and an exposure adjustment mechanism are operated, and when the release button is pushed down to the lowest point, a shutter is opened.

By pushing down or rotating the main switch 1401, the power of the digital camera is switched on or off.

The viewfinder 1402 is arranged above the lens 1404, which is on the front side of the digital camera, for checking a shooting range and the focus point from the eyepiece finder 1407 shown in FIG. 19B.

The flash portion 1403 is located in the upper portion of the front side of the digital camera. When the luminance of the photographic subject is not enough, the release button may be pushed down to open the shutter and deliver auxiliary light from the flash portion 1403.

The lens 1404 is located at the front side of the digital camera and includes a focusing lens, a zoom lens, and the like. The lens 1404 forms a photographic optical system together with a shutter and a diaphragm which are not illustrated. In addition, behind the lens, an image sensor such as a CCD (charge coupled device) is provided.

The lens barrel 1405 is for moving a lens position to adjust the focus of the focusing lens, the zoom lens, and the like. In shooting, the lens barrel is slid out to move the lens 1404 forward. When the digital camera is carried, the lens 1404 is moved backward so that the camera can be compact. Note that Embodiment 4 employs a structure in which the lens barrel is slid out so that the object can be shot by being zoomed-in; however, the structure is not limited thereto. Instead, a digital camera may employ a structure in which zoom shooting can be performed without the lens barrel being slid out due to a structure of the photographing optical system inside the housing 1406.

The eyepiece finder 1407 is located in the upper position on the backside of the digital camera for looking therethrough in checking a shooting range and the focus point.

The operation buttons 1409 are for various functions provided on the backside of the digital camera, which include a set up button, a menu button, a display button, a function button, a selecting button, and the like.

When the photoelectric conversion device which is an embodiment of the present invention is incorporated into the camera illustrated in FIGS. 19A and 19B, the photoelectric conversion device can detect existence or nonexistence of light and light intensity, so that exposure adjustment or the like of the camera can be performed.

With the photoelectric conversion device which is an embodiment of the present invention as above, the resolution to the luminance of light in the photoelectric conversion can be improved. Therefore, when the photoelectric conversion device which is an embodiment of the present invention is mounted on the above electronic appliance, the luminance adjustment can be performed more accurately.

In addition, the photoelectric conversion device which is an embodiment of the present invention can also be applied to other electronic appliances such as a projection TV and a navigation system, for example. In other words, the photoelectric conversion device can be applied to any electronic appliance where light detection is necessary.

This application is based on Japanese Patent Application serial no. 2008-165958 filed with Japan Patent Office on Jun. 25, 2008, the entire contents of which are hereby incorporated by reference.

What is claimed is:

1. A photoelectric conversion device comprising:
   a photoelectric conversion circuit for generating a first current in accordance with illuminance of incident light;
   a charge/discharge circuit, wherein the charge/discharge circuit comprises a first capacitor comprising a first terminal and a second terminal, a second capacitor comprising a first terminal and a second terminal, and a third switching element configured to control conduction between the first terminal of the first capacitor and the first terminal of the second capacitor in accordance with the first current;
   a first switching element configured to control conduction between the photoelectric conversion circuit and the charge/discharge circuit;
   a current circuit for generating a second current;
   a second switching element configured to control conduction between the charge/discharge circuit and the current circuit;
   a comparator for comparing a reference potential and an output potential of the charge/discharge circuit; and
   a comparison circuit which compares a second reference potential with a potential of a connection portion between the second input terminal of the comparator and the charge/discharge circuit and which outputs a control signal for controlling on/off of the third switching element based on a result of the comparison.

2. A photoelectric conversion device according to claim 1, wherein the first switching element is off when the second switching element is on and the second switching element is off when the first switching element is on.

3. A photoelectric conversion device according to claim 1, wherein the photoelectric conversion circuit comprises a photoelectric conversion element and an amplifier circuit for amplifying current flowing to the photoelectric conversion element.

4. A photoelectric conversion device according to claim 1, further comprising:
   a clock signal generating circuit for generating a clock signal;
   a counter circuit for counting an edge of the clock signal; and
   a latch circuit for holding a count value of the counter circuit in accordance with an output signal of the comparator.

5. An electronic appliance on which the photoelectric conversion device according to claim 1 is mounted.

6. A photoelectric conversion device according to claim 1, wherein the photoelectric conversion device is incorporated into one selected from the group consisting of a cellular phone, a computer, a display device, and a camera.

7. A photoelectric conversion device according to claim 1, wherein the second current has a constant amount.

8. A photoelectric conversion device comprising:
   a photoelectric conversion circuit for generating a first current in accordance with illuminance of incident light;
   a charge/discharge circuit whose electrical capacitance changes between an electrical capacitance $C_a$ and an electrical capacitance $C_b$, wherein the electrical capacitance $C_a$ is an electrical capacitance value of a first capacitor having a first terminal which is electrically connected to the photoelectric conversion circuit via a first switching element, and wherein the electrical capacitance $C_b$ is a sum of the electrical capacitance value of the first capacitor and an electrical capacitance value of a second capacitor having a first terminal which is electrically connected to the first terminal of the first capacitor via a third switching element;
   a current circuit for generating a second current;
   a second switching element which is turned on or off so as to control conduction between the charge/discharge circuit and the current circuit;
   a comparator comprising a first input terminal and a second input terminal, wherein a signal with a reference potential is input to the first input terminal and the second input terminal is electrically connected to the charge/discharge circuit; and
   a comparison circuit which compares a second reference potential with a potential of a connection portion between the second input terminal of the comparator and the charge/discharge circuit and which outputs a control signal for controlling on/off of the third switching element based on a result of the comparison.

9. A photoelectric conversion device according to claim 8, wherein the first switching element is off when the second switching element is on and the second switching element is off when the first switching element is on.

10. A photoelectric conversion device according to claim 8, wherein the photoelectric conversion circuit comprises a photoelectric conversion element and an amplifier circuit for amplifying current flowing to the photoelectric conversion element.

11. A photoelectric conversion device according to claim 8, further comprising:

a clock signal generating circuit for generating a clock signal;

a counter circuit for counting an edge of the clock signal; and a latch circuit for holding a count value of the counter circuit in accordance with an output signal of the comparator.

12. An electronic appliance on which the photoelectric conversion device according to claim 8 is mounted.

13. A photoelectric conversion device according to claim 8, wherein the photoelectric conversion device is incorporated into one selected from the group consisting of a cellular phone, a computer, a display device, and a camera.

14. A photoelectric conversion device according to claim 8, wherein the second current has a constant amount.

15. A photoelectric conversion device comprising:

a photoelectric conversion circuit for generating a first current in accordance with illuminance of incident light;

a charge/discharge circuit whose electrical capacitance changes between an electrical capacitance $C_a$ and an electrical capacitance $C_b$, wherein the electrical capacitance $C_a$ is an electrical capacitance value of a first capacitor having a first terminal which is electrically connected to the photoelectric conversion circuit via a first switching element and wherein the electrical capacitance $C_b$ is a sum of the electrical capacitance value of the first capacitor and an electrical capacitance value of a second capacitor having a first terminal which is electrically connected to the first terminal of the first capacitor via a third switching element;

a current circuit for generating a second current;

a second switching element which is turned on or off so as to control conduction between the charge/discharge circuit and the current circuit;

a comparator comprising a first input terminal and a second input terminal, wherein a signal with a reference potential is input to the first input terminal and the second input terminal is electrically connected to the charge/discharge circuit; and a comparison circuit which compares a second reference potential with a potential of a connection portion between the second input terminal of the comparator and the charge/discharge circuit and which outputs a control signal for controlling on/off of the third switching element based on a result of the comparison, wherein a second terminal of the first capacitor is grounded, and wherein a second terminal of the second capacitor is grounded.

16. A photoelectric conversion device according to claim 15, wherein the first switching element is off when the second switching element is on and the second switching element is off when the first switching element is on.

17. A photoelectric conversion device according to claim 15, wherein the photoelectric conversion circuit comprises a photoelectric conversion element and an amplifier circuit for amplifying current flowing to the photoelectric conversion element.

18. A photoelectric conversion device according to claim 15, further comprising:

a clock signal generating circuit for generating a clock signal;

a counter circuit for counting an edge of the clock signal; and a latch circuit for holding a count value of the counter circuit in accordance with an output signal of the comparator.

19. An electronic appliance on which the photoelectric conversion device according to claim 15 is mounted.

20. A photoelectric conversion device according to claim 15, wherein the photoelectric conversion device is incorporated into one selected from the group consisting of a cellular phone, a computer, a display device, and a camera.

21. A photoelectric conversion device according to claim 15, wherein the second current has a constant amount.

* * * * *